US012696482B2

(12) United States Patent
Kato et al.

(10) Patent No.:    US 12,696,482 B2
(45) Date of Patent:    Jul. 28, 2026

(54) SEMICONDUCTOR DEVICE

(71) Applicant: Nuvoton Technology Corporation Japan, Kyoto (JP)

(72) Inventors: Ryou Kato, Osaka (JP); Ryosuke Okawa, Nara (JP); Ryo Yoshii, Kyoto (JP); Eiji Yasuda, Osaka (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 0 days.

(21) Appl. No.: 19/264,384

(22) Filed: Jul. 9, 2025

(65) Prior Publication Data

US 2025/0344440 A1      Nov. 6, 2025

Related U.S. Application Data

(63) Continuation of application No. PCT/JP2024/005350, filed on Feb. 15, 2024.
(Continued)

(51) Int. Cl.
H10D 30/66      (2025.01)
H10D 8/00      (2025.01)
(Continued)

(52) U.S. Cl.
CPC ......... H10D 30/668 (2025.01); H10D 30/665 (2025.01); H10D 62/102 (2025.01);
(Continued)

(58) Field of Classification Search
CPC .. H10D 30/668; H10D 64/117; H10D 62/127; H10D 64/519
See application file for complete search history.

(56) References Cited

U.S. PATENT DOCUMENTS

| | | | |
|---|---|---|---|
| 11,114,559 B2 | 9/2021 | Park et al. | |
| 2012/0061753 A1* | 3/2012 | Nishiwaki | H10D 30/668 |
| | | | 257/E29.264 |

(Continued)

FOREIGN PATENT DOCUMENTS

| | | |
|---|---|---|
| JP | 2012-059943 A | 3/2012 |
| JP | 2014-187198 A | 10/2014 |

(Continued)

OTHER PUBLICATIONS

International Search Report dated May 7, 2024 issued in International Patent Application No. PCT/JP2024/005350, with English translation.
(Continued)

*Primary Examiner* — Samuel A Gebremariam
*Assistant Examiner* — Jonas T Beardsley
(74) *Attorney, Agent, or Firm* — Rimon P.C.

(57)      ABSTRACT

A semiconductor device includes a vertical metal-oxide semiconductor (MOS) transistor that includes: first trenches provided from an upper surface of a low-concentration impurity layer and penetrating through a body region, and extending in a first direction; and second trenches provided from the upper surface of the low-concentration impurity layer and penetrating through the body region to a depth deeper than the depth of the first trenches, and extending in the first direction. The first trenches and the second trenches are alternately disposed in a second direction, first conductors connected to a gate electrode are provided inside the first trenches and in upper portions inside the second trenches, second conductors connected to the source electrode are provided in lower portions inside the second trenches, and a pitch between the second conductors is twice a pitch between the first conductors in the second direction.

4 Claims, 39 Drawing Sheets

Related U.S. Application Data

(60) Provisional application No. 63/496,195, filed on Apr. 14, 2023.

(51) Int. Cl.
| | |
|---|---|
| *H10D 30/01* | (2025.01) |
| *H10D 62/10* | (2025.01) |
| *H10D 62/60* | (2025.01) |
| *H10D 64/23* | (2025.01) |
| *H10D 84/00* | (2025.01) |

(52) U.S. Cl.
CPC ........... *H10D 62/126* (2025.01); *H10D 62/60* (2025.01); *H10D 64/252* (2025.01); *H10D 8/411* (2025.01); *H10D 30/0297* (2025.01); *H10D 84/143* (2025.01)

(56) References Cited

U.S. PATENT DOCUMENTS

| | | | |
|---|---|---|---|
| 2014/0284707 | A1 | 9/2014 | Kawamura et al. |
| 2017/0263768 | A1 | 9/2017 | Katoh et al. |
| 2017/0294518 | A1* | 10/2017 | Osawa ................. H10D 62/115 |
| 2019/0296133 | A1 | 9/2019 | Iwakaji et al. |
| 2021/0074848 | A1 | 3/2021 | Katou et al. |

FOREIGN PATENT DOCUMENTS

| | | |
|---|---|---|
| JP | 2017-163122 A | 9/2017 |
| JP | 2019-169597 A | 10/2019 |
| JP | 2021-040105 A | 3/2021 |

OTHER PUBLICATIONS

Notice of Reasons for Refusal dated Dec. 10, 2024 issued in Japanese Patent Application No. 2024-553734, with English translation.

Decision to Grant a Patent dated Feb. 12, 2025 issued in Japanese Patent Application No. 2024-553734, with English translation.

* cited by examiner

— 38
— 18
— 33

Resist

FIG. 5E
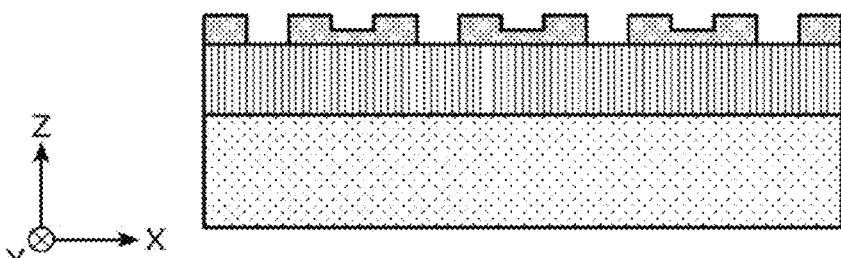
FIG. 5F
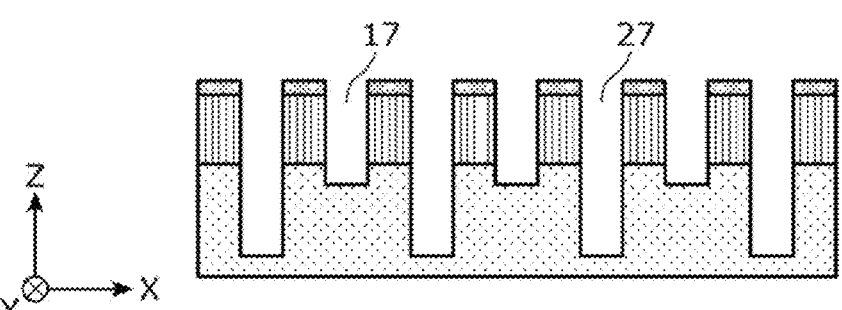
FIG. 5G
FIG. 5H
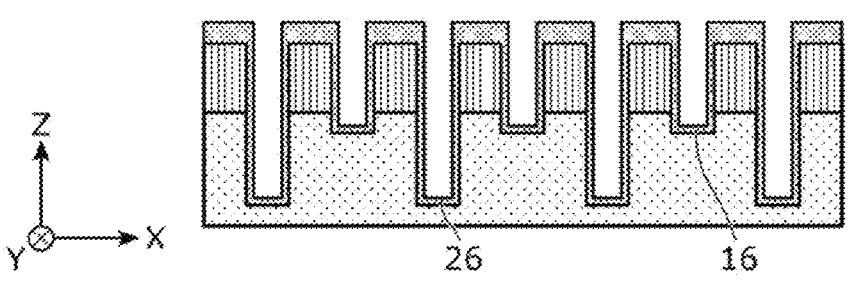

FIG. 5I
25
FIG. 5J
36
FIG. 5K
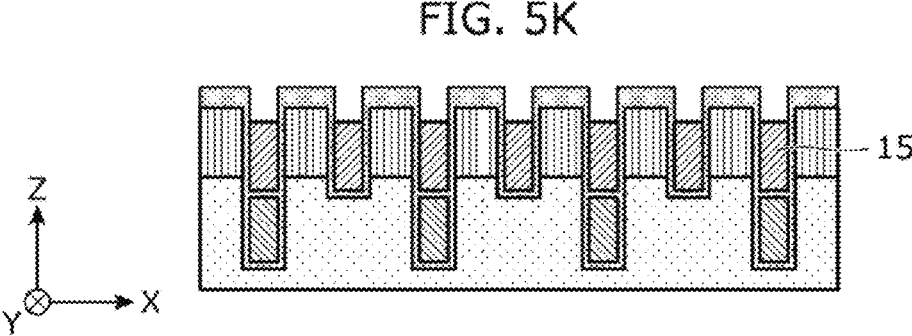
15
FIG. 5L
34
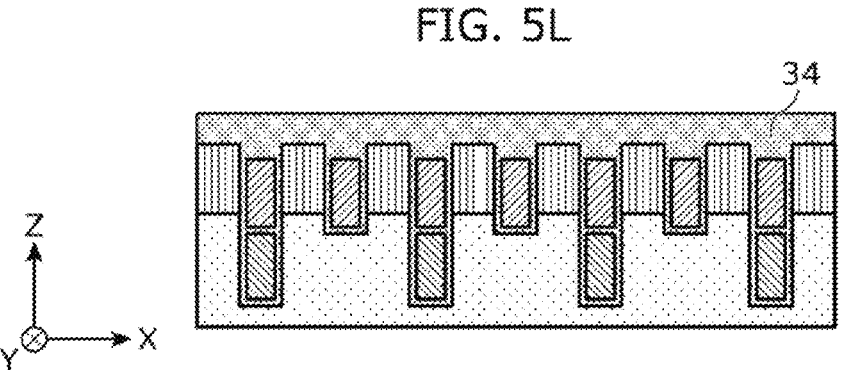

SEMICONDUCTOR DEVICE

CROSS REFERENCE TO RELATED APPLICATIONS

This is a continuation application of PCT International Patent Application No. PCT/JP2024/005350 filed on Feb. 15, 2024, designating the United States of America, which is based on and claims priority of U.S. Provisional Patent Application No. 63/496,195 filed on Apr. 14, 2023. The entire disclosures of the above-identified applications, including the specifications, drawings and claims are incorporated herein by reference in their entirety.

FIELD

The present disclosure relates to a semiconductor device.

BACKGROUND

Conventionally, semiconductor devices have been known (for example, refer to Patent Literature (PTL) 1).

CITATION LIST

Patent Literature

PTL 1: Japanese Unexamined Patent Application Publication No. 2021-40105

SUMMARY

Technical Problem

There has been a demand for vertical metal-oxide semiconductor (MOS) transistors to have an increased breakdown voltage and at the same time, to have lower conduction resistance (On-Resistance). The present disclosure provides a semiconductor device that includes a vertical MOS transistor for which conduction resistance can be decreased while increasing the breakdown voltage thereof.

Solution to Problem

In order to address such a problem as above, a semiconductor device according to the present disclosure is a semiconductor device including: a vertical metal-oxide semiconductor (MOS) transistor that includes: a semiconductor substrate of a first conductivity type; a low-concentration impurity layer of the first conductivity type, the low-concentration impurity layer being provided above and in contact with the semiconductor substrate and having an impurity concentration lower than a predetermined impurity concentration of the semiconductor substrate; a body region of a second conductivity type that is different from the first conductivity type, the body region being provided in the low-concentration impurity layer; a source region of the first conductivity type, the source region being provided in the body region; a source electrode electrically connected to the body region and the source region; a plurality of first trenches provided from an upper surface of the low-concentration impurity layer and penetrating through the body region to a depth up to a portion of the low-concentration impurity layer, the plurality of first trenches each having a portion in contact with the source region and extending in a first direction parallel to the upper surface of the low-concentration impurity layer; and a plurality of second trenches provided from the upper surface of the low-concentration impurity layer and penetrating through the body region to a depth deeper than the depth of the plurality of first trenches, the plurality of second trenches each having a portion in contact with the source region and extending in the first direction. The plurality of first trenches and the plurality of second trenches are alternately disposed in a second direction parallel to the upper surface of the low-concentration impurity layer and orthogonal to the first direction, a plurality of first conductors connected to a gate electrode of the vertical MOS transistor are provided inside the plurality of first trenches and in upper portions inside the plurality of second trenches, a plurality of second conductors connected to the source electrode and separated from the plurality of first conductors are provided in lower portions inside the plurality of second trenches, and a pitch between the plurality of second conductors in the second direction is twice a pitch between the plurality of first conductors in the second direction.

According to the configuration described above, conduction resistance of the vertical MOS transistor can be decreased while increasing the breakdown voltage thereof.

In addition, another semiconductor device according to the present disclosure is a semiconductor device including: a vertical metal-oxide semiconductor (MOS) transistor that includes: a semiconductor substrate of a first conductivity type; a low-concentration impurity layer of the first conductivity type provided above and in contact with the semiconductor substrate and having an impurity concentration lower than a predetermined impurity concentration of the semiconductor substrate; a body region of a second conductivity type that is different from the first conductivity type, the body region being provided in the low-concentration impurity layer; a source region of the first conductivity type, the source region being provided in the body region; a source electrode electrically connected to the body region and the source region; and a plurality of trenches provided from an upper surface of the low-concentration impurity layer and penetrating through the body region to a depth up to a portion of the low-concentration impurity layer, the plurality of trenches each having a portion in contact with the source region and extending in a first direction parallel to the upper surface of the low-concentration impurity layer. The plurality of trenches are disposed at a regular pitch in a second direction parallel to the upper surface of the low-concentration impurity layer and orthogonal to the first direction, a plurality of first conductors connected to a gate electrode of the vertical MOS transistor are provided in upper portions inside the plurality of trenches, a plurality of second conductors connected to the source electrode and separated from the plurality of first conductors are provided in lower portions inside the plurality of trenches, the plurality of trenches each include relatively shallow portions and relatively deep portions cyclically in the first direction, the relatively shallow portions having a relatively shallow depth from the upper surface of the low-concentration impurity layer, the relatively deep portions having a relatively deep depth from the upper surface of the low-concentration impurity layer, in the first direction, the plurality of first conductors have a fixed length in a third direction orthogonal to both of the first direction and the second direction, and a length of each of the plurality of second conductors in the third direction cyclically varies in the first direction.

According to the configuration described above, conduction resistance of the vertical MOS transistor can be decreased while increasing the breakdown voltage thereof.

In addition, another semiconductor device according to the present disclosure is a semiconductor device including: a vertical metal-oxide semiconductor (MOS) transistor that includes: a semiconductor substrate of a first conductivity type; a low-concentration impurity layer of the first conductivity type, the low-concentration impurity layer being provided above and in contact with the semiconductor substrate and having an impurity concentration lower than a predetermined impurity concentration of the semiconductor substrate; a body region of a second conductivity type that is different from the first conductivity type, the body region being provided in the low-concentration impurity layer; a plurality of source regions of the first conductivity type, the plurality of source regions being provided in the body region; a source electrode electrically connected to the body region and the plurality of source regions; a plurality of first trenches provided from an upper surface of the low-concentration impurity layer and penetrating through the body region to a depth up to a portion of the low-concentration impurity layer, the plurality of first trenches each having a portion in contact with at least one of the plurality of source regions and extending in a first direction parallel to the upper surface of the low-concentration impurity layer; and a plurality of second trenches provided from the upper surface of the low-concentration impurity layer and penetrating through the body region to a depth deeper than the depth of the plurality of first trenches, the plurality of second trenches extending in a second direction parallel to the upper surface of the low-concentration impurity layer and orthogonal to the first direction. A plurality of first conductors connected to a gate electrode of the vertical MOS transistor are provided inside the plurality of first trenches, and a plurality of second conductors connected to the source electrode are provided inside the plurality of second trenches.

According to the configuration described above, conduction resistance of the vertical MOS transistor can be decreased while increasing the breakdown voltage thereof.

Advantageous Effects

The present disclosure can provide a semiconductor device that includes a vertical MOS transistor having lower conduction resistance (On-Resistance) and at the same time, having an increased breakdown voltage.

BRIEF DESCRIPTION OF DRAWINGS

These and other advantages and features will become apparent from the following description thereof taken in conjunction with the accompanying Drawings, by way of non-limiting examples of embodiments disclosed herein.

4

Figure 3A:
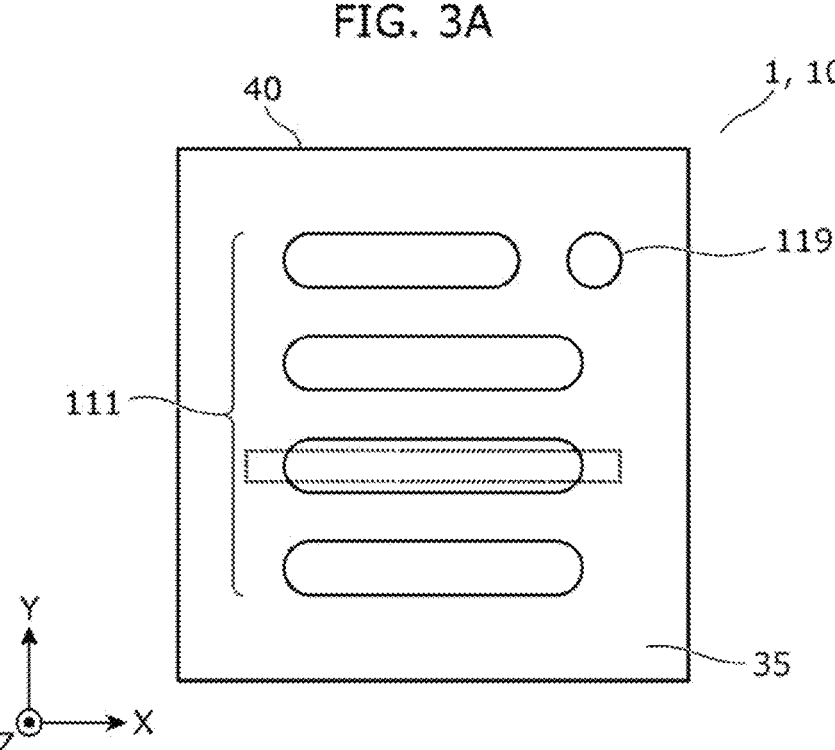
FIG. 3A is a plan schematic diagram illustrating an example of a structure of the semiconductor device according to Embodiment 1.
Figure 3B:
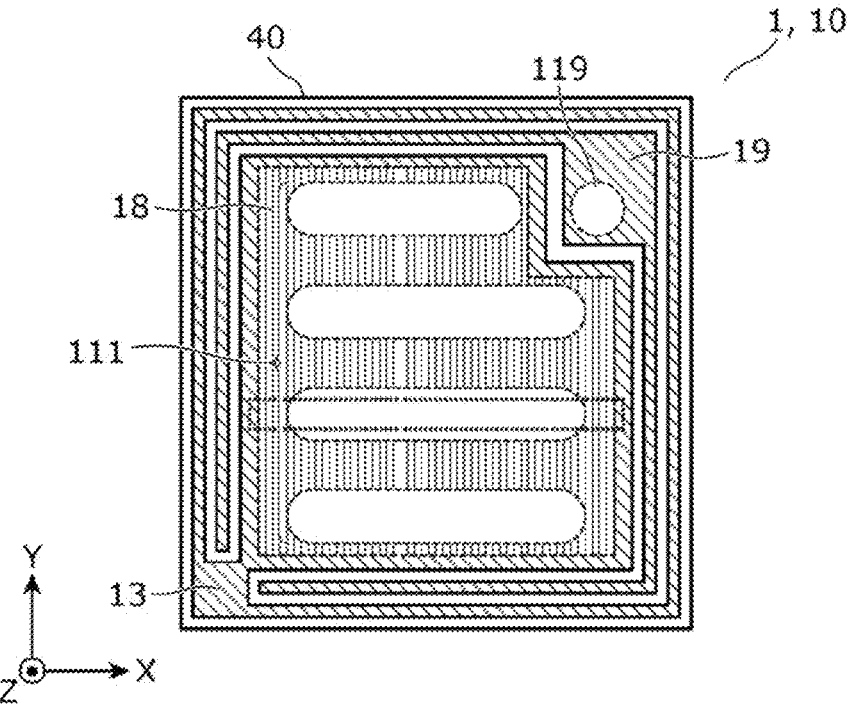

FIG. 3B is a plan schematic diagram that is an illustration in which a partial structure exposed from the surface is removed to show an example of an internal structure of the semiconductor device according to Embodiment 1.

Figure 4A:
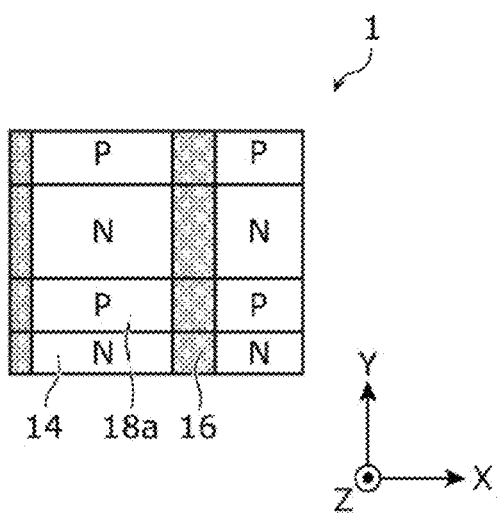

FIG. 4A is a plan schematic diagram illustrating an example of a substantially unit configuration of a transistor according to Embodiment 1.

Figure 4B:
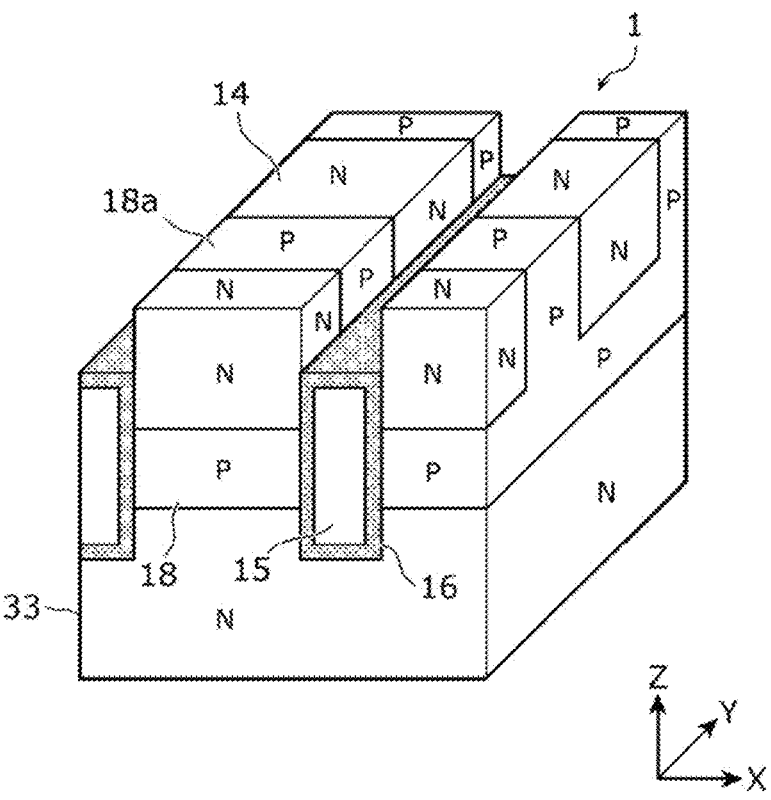

FIG. 4B is a perspective schematic diagram illustrating an example of a substantially unit configuration of a transistor according to Embodiment 1.

Figure 5A:
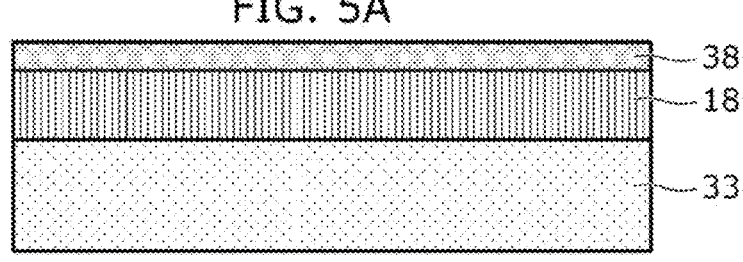
Figure 5A:
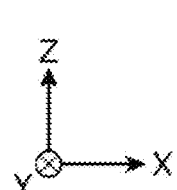

FIG. 5A is a cross-sectional schematic diagram illustrating a process of manufacturing the semiconductor device according to Embodiment 1.

Figure 5B:
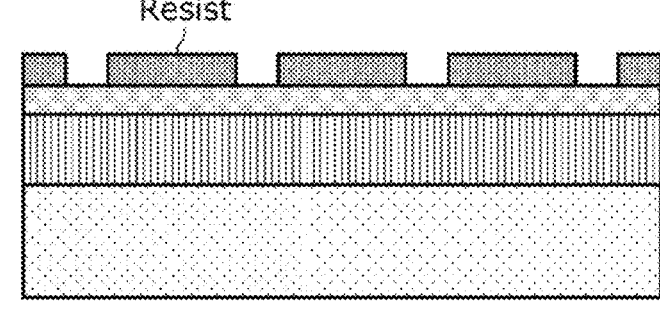
Figure 5B:
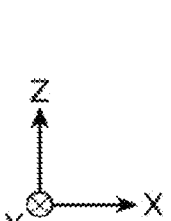

FIG. 5B is a cross-sectional schematic diagram illustrating a process of manufacturing the semiconductor device according to Embodiment 1.

Figure 5C:
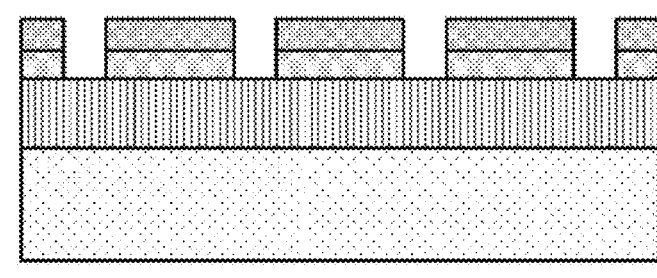
Figure 5C:
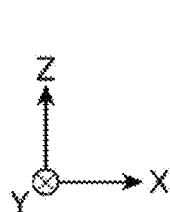

FIG. 5C is a cross-sectional schematic diagram illustrating a process of manufacturing the semiconductor device according to Embodiment 1.

Figure 5D:
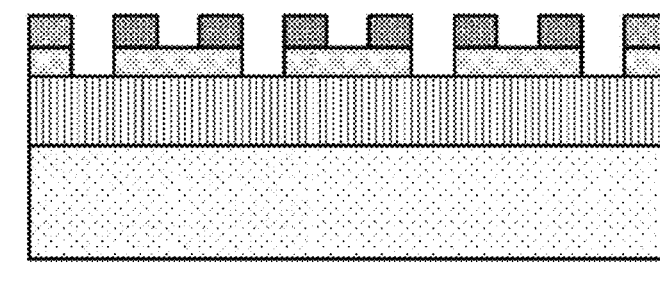
Figure 5D:
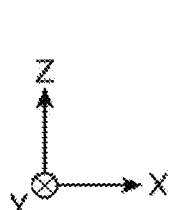

FIG. 5D is a cross-sectional schematic diagram illustrating a process of manufacturing the semiconductor device according to Embodiment 1.

FIG. 5E is a cross-sectional schematic diagram illustrating a process of manufacturing the semiconductor device according to Embodiment 1.

FIG. 5F is a cross-sectional schematic diagram illustrating a process of manufacturing the semiconductor device according to Embodiment 1.

FIG. 5G is a cross-sectional schematic diagram illustrating a process of manufacturing the semiconductor device according to Embodiment 1.

FIG. 5H is a cross-sectional schematic diagram illustrating a process of manufacturing the semiconductor device according to Embodiment 1.

FIG. 5I is a cross-sectional schematic diagram illustrating a process of manufacturing the semiconductor device according to Embodiment 1.

FIG. 5J is a cross-sectional schematic diagram illustrating a process of manufacturing the semiconductor device according to Embodiment 1.

FIG. 5K is a cross-sectional schematic diagram illustrating a process of manufacturing the semiconductor device according to Embodiment 1.

FIG. 5L is a cross-sectional schematic diagram illustrating a process of manufacturing the semiconductor device according to Embodiment 1.

Figure 6:
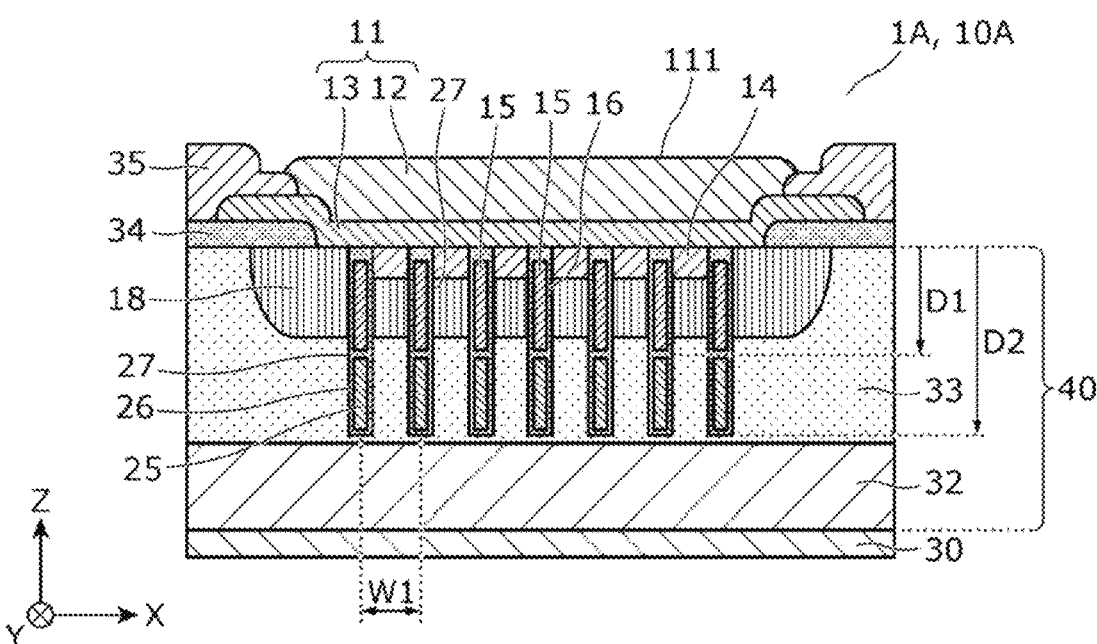

FIG. 6 is a cross-sectional schematic diagram illustrating an example of a structure of a semiconductor device according to Comparative Example 1 of Embodiment 1.

Figure 7A:
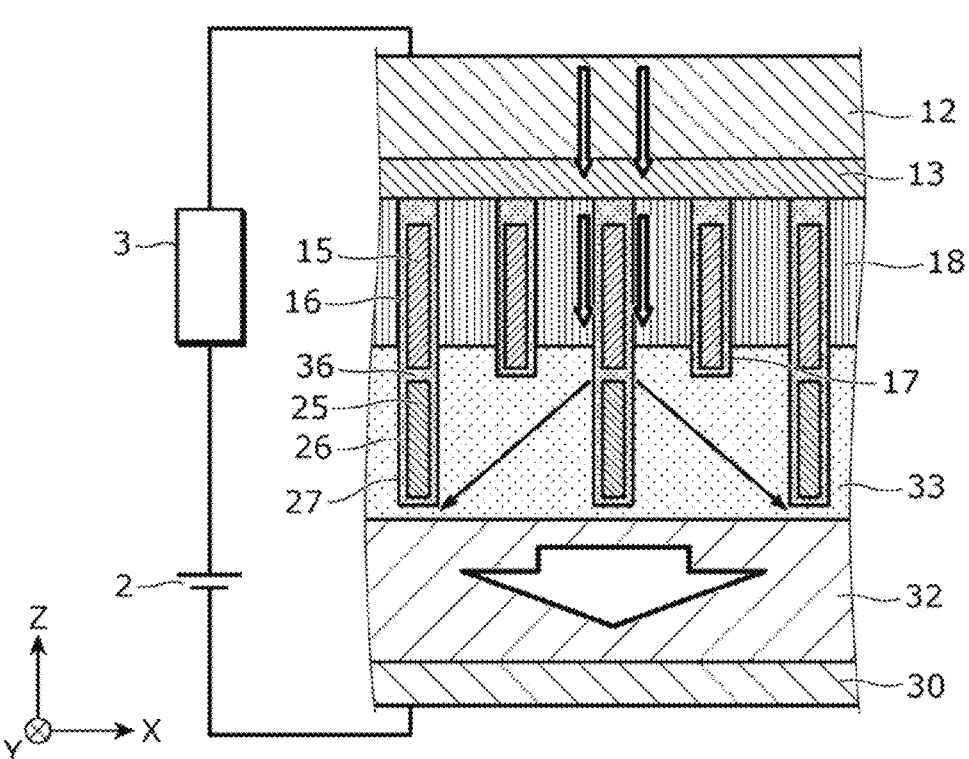

FIG. 7A is a cross-sectional schematic diagram for explaining effects yielded by the semiconductor device according to Embodiment 1.

Figure 7B:
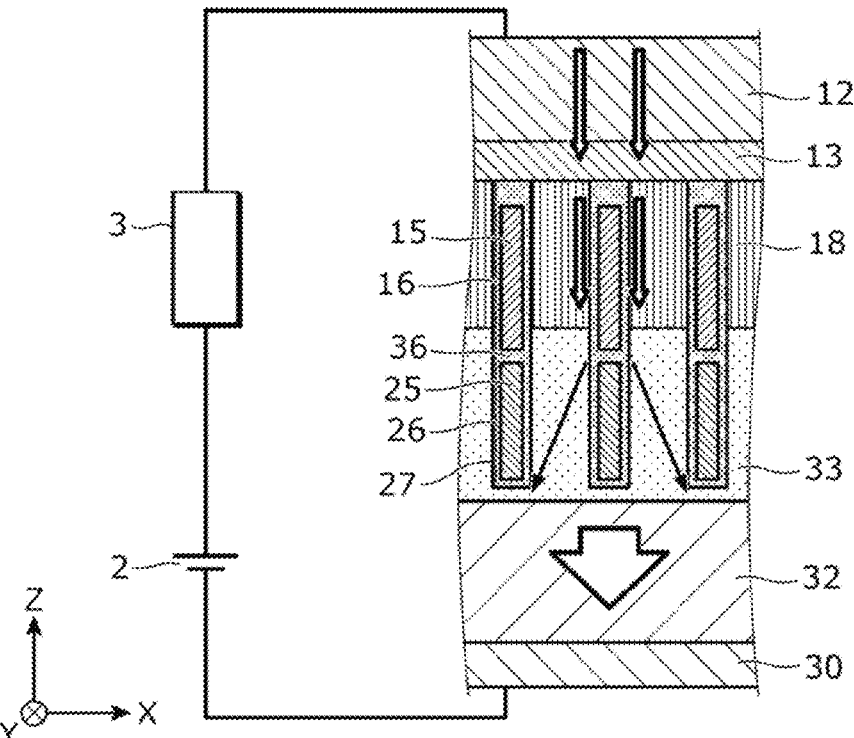

FIG. 7B is a cross-sectional schematic diagram for explaining the semiconductor device according to Comparative Example 1 of Embodiment 1 in comparison with the semiconductor device according to Embodiment 1.

Figure 8:
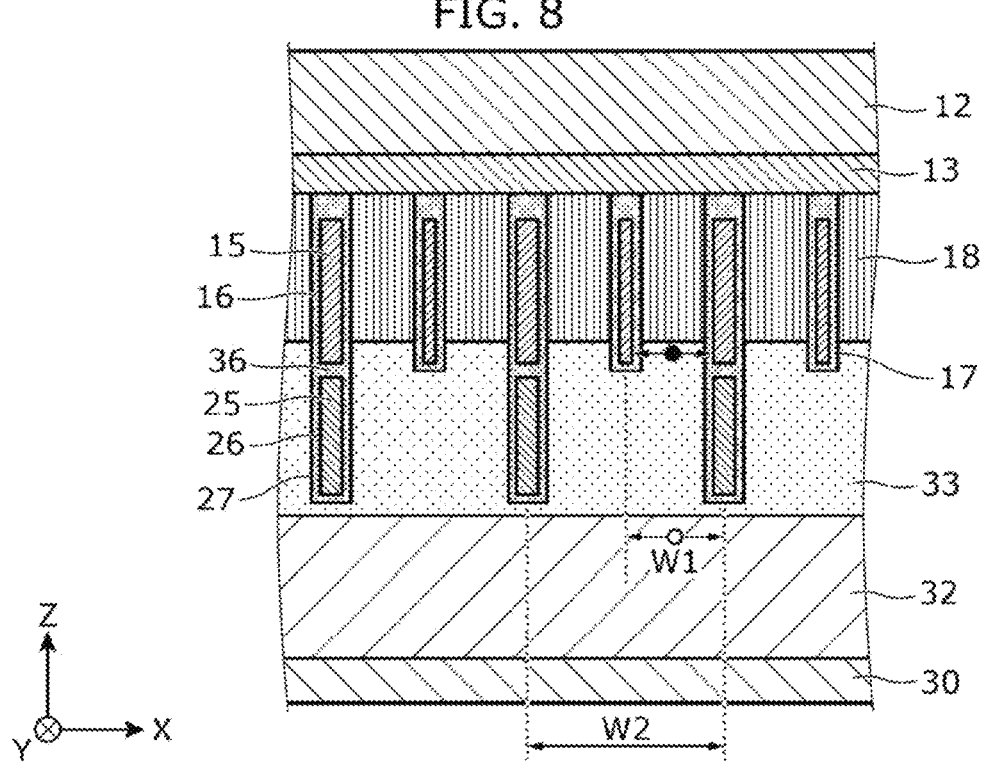

FIG. 8 is a cross-sectional schematic diagram for explaining a variation of the semiconductor device according to Embodiment 1.

Figure 9A:
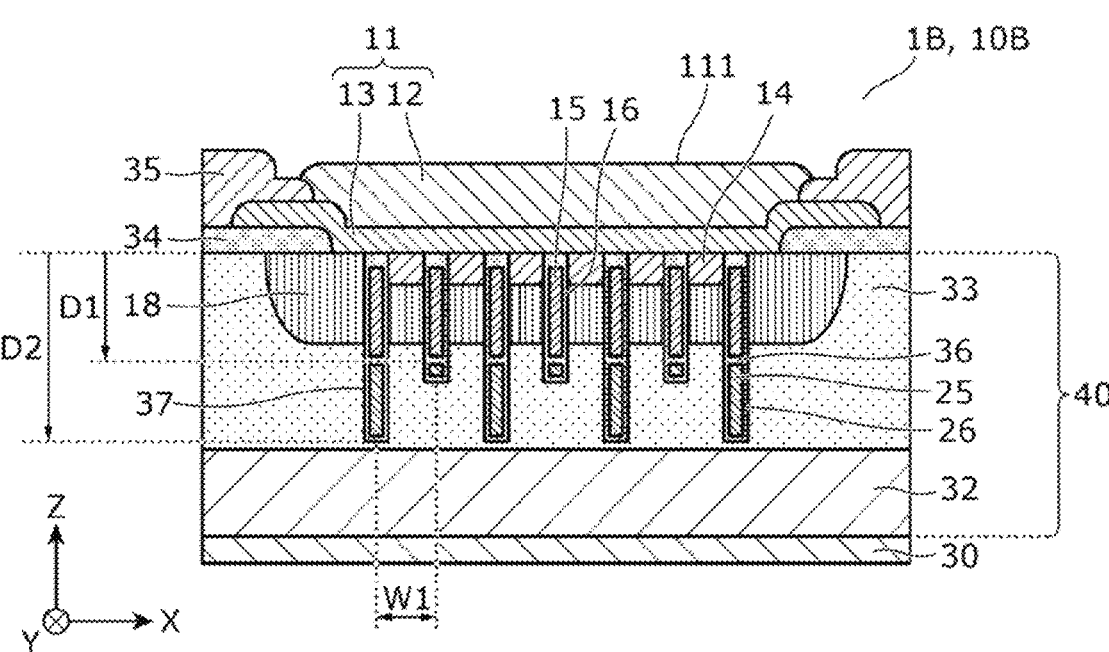

FIG. 9A is a cross-sectional schematic diagram illustrating an example of a structure of a semiconductor device according to Embodiment 2.

Figure 9B:
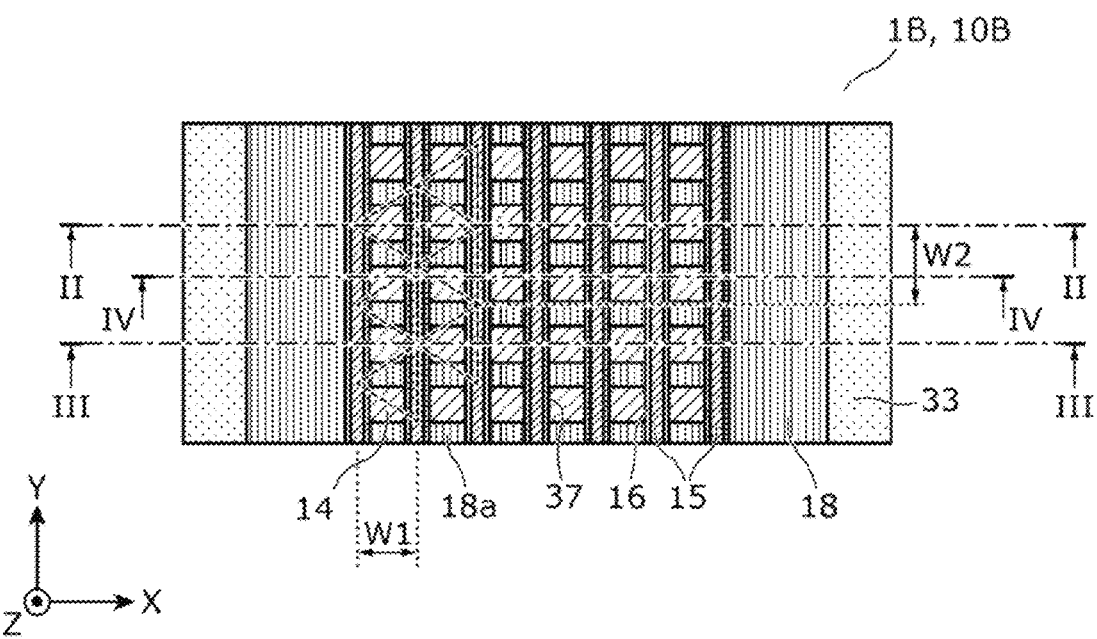

FIG. 9B is a plan schematic diagram illustrating an example of a structure of the semiconductor device according to Embodiment 2.

Figure 9C:
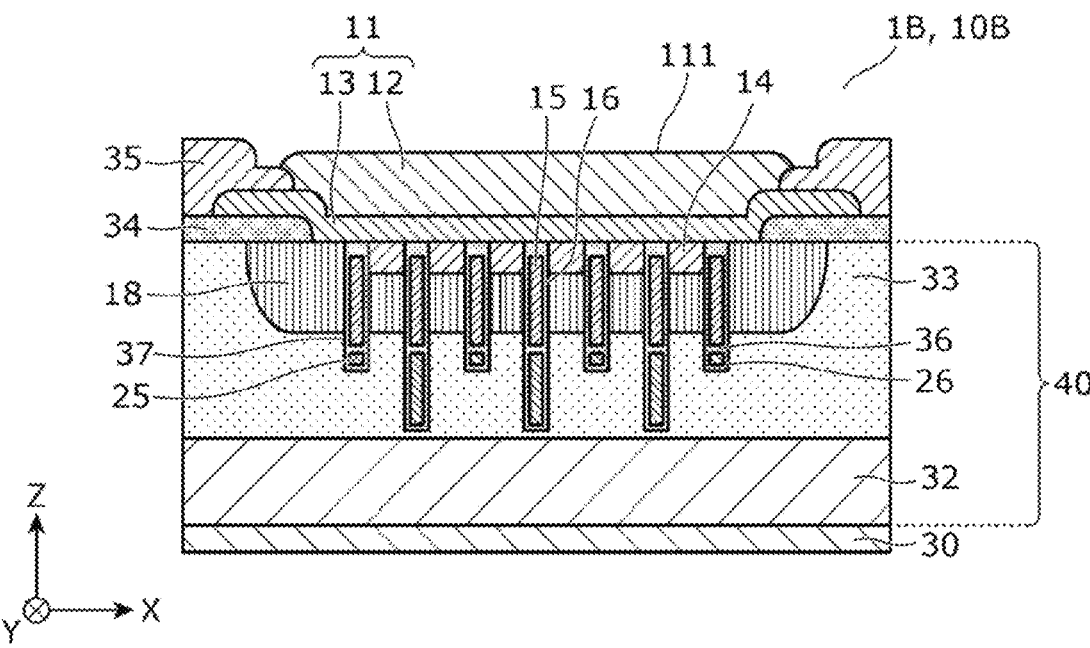

FIG. 9C is a cross-sectional schematic diagram illustrating an example of a structure of the semiconductor device according to Embodiment 2.

Figure 9D:
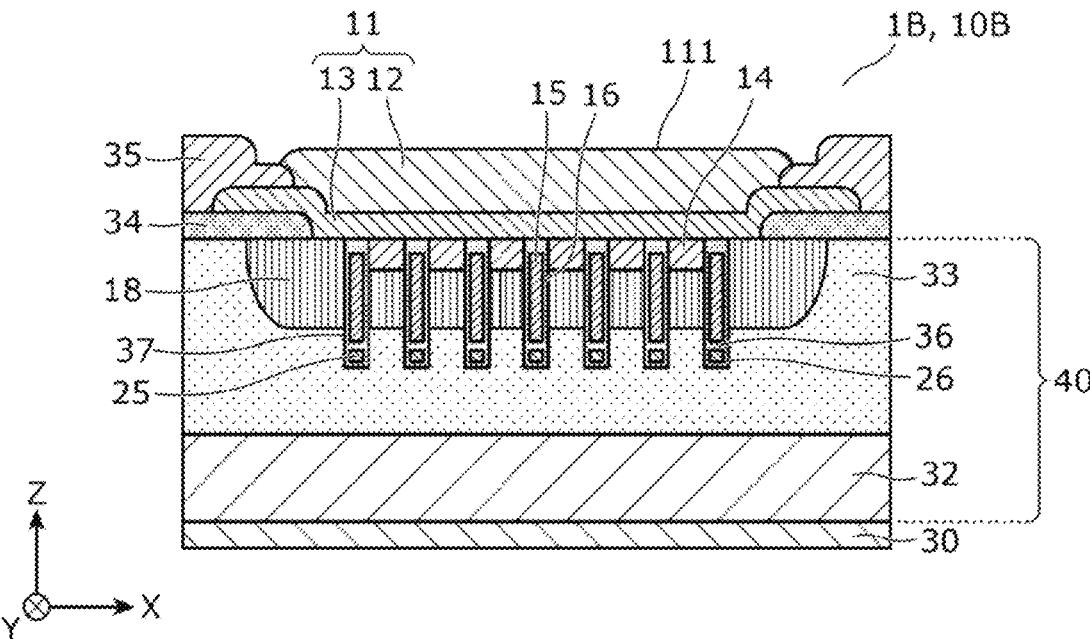

FIG. 9D is a cross-sectional schematic diagram illustrating an example of a structure of the semiconductor device according to Embodiment 2.

Figure 10:
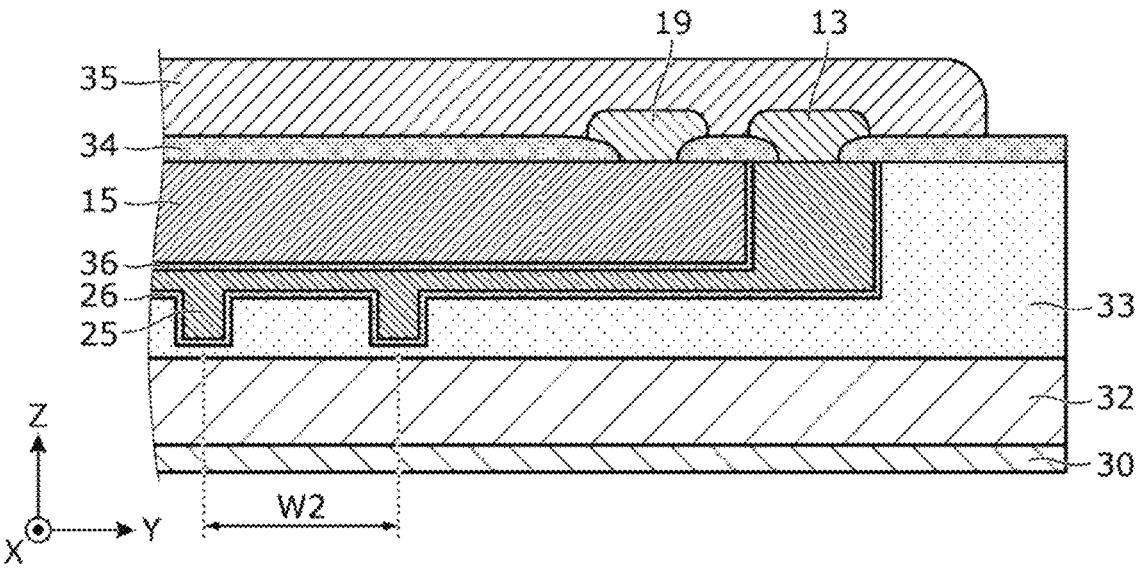

FIG. 10 is a cross-sectional schematic diagram illustrating an example of a structure of the semiconductor device according to Embodiment 2.

Figure 11A:
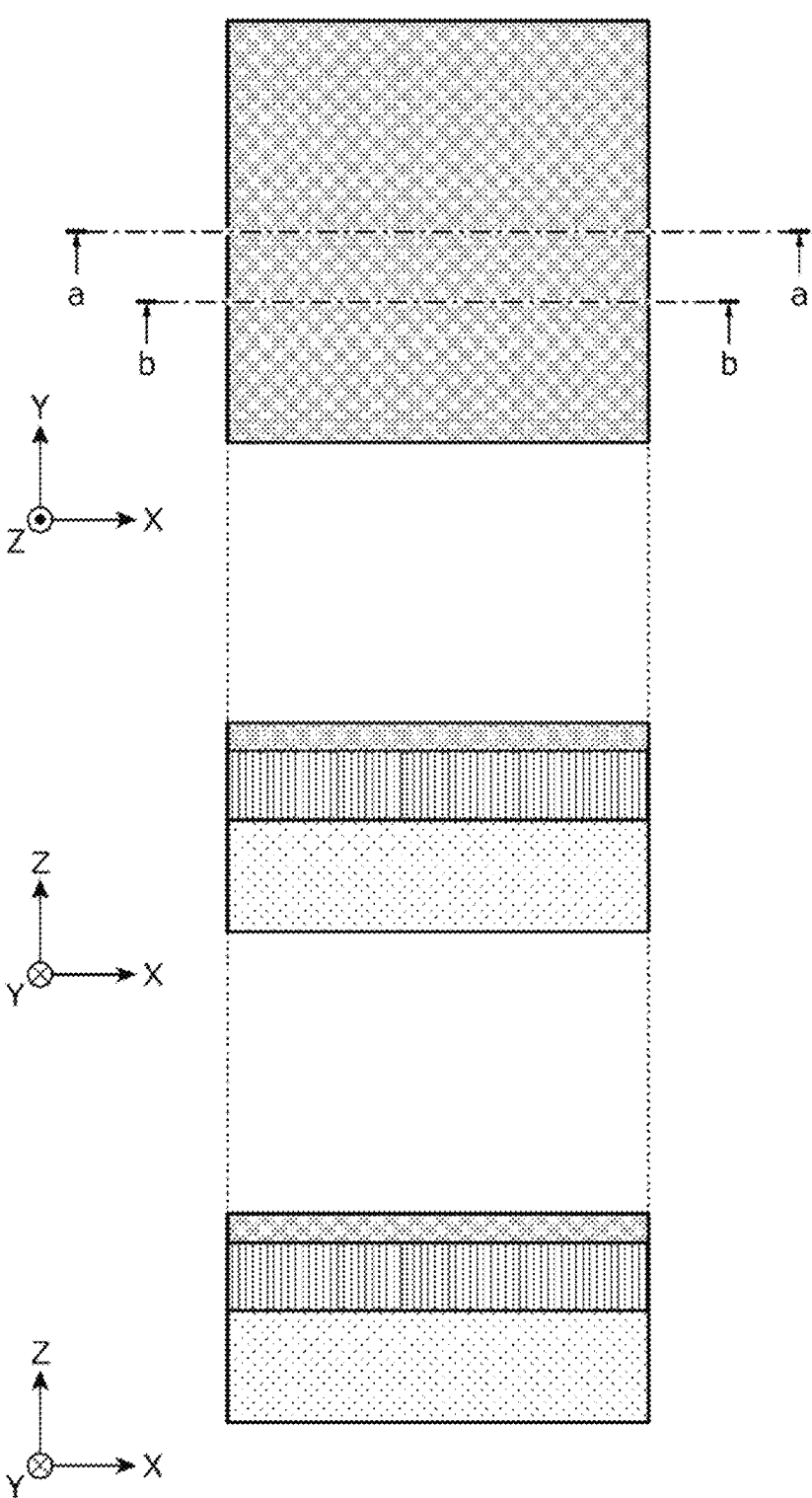

FIG. 11A shows a plan schematic diagram and cross-sectional schematic diagrams illustrating a process of manufacturing the semiconductor device according to Embodiment 2.

Figure 11B:
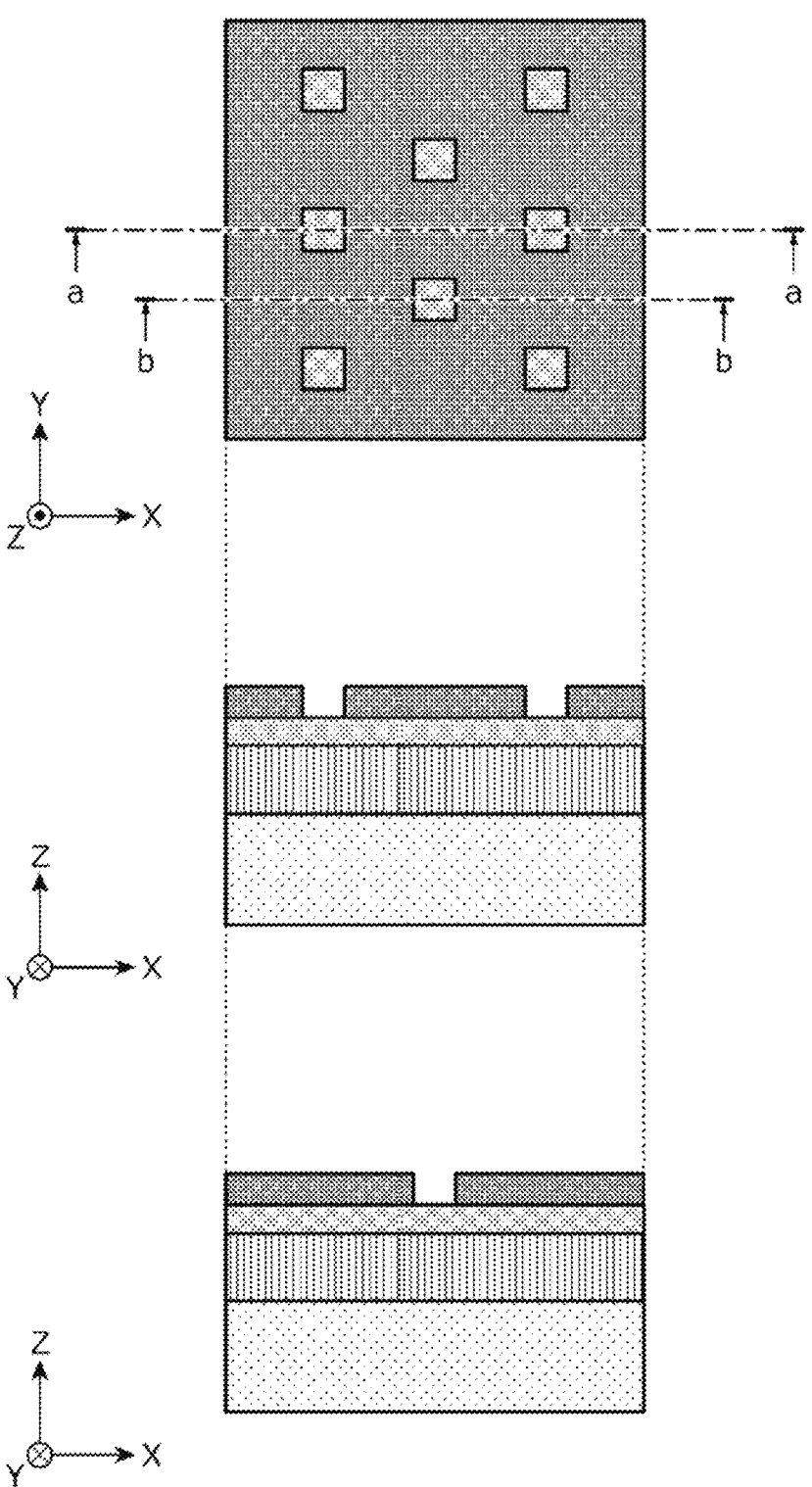

FIG. 11B shows a plan schematic diagram and cross-sectional schematic diagrams illustrating a process of manufacturing the semiconductor device according to Embodiment 2.

Figure 11C:
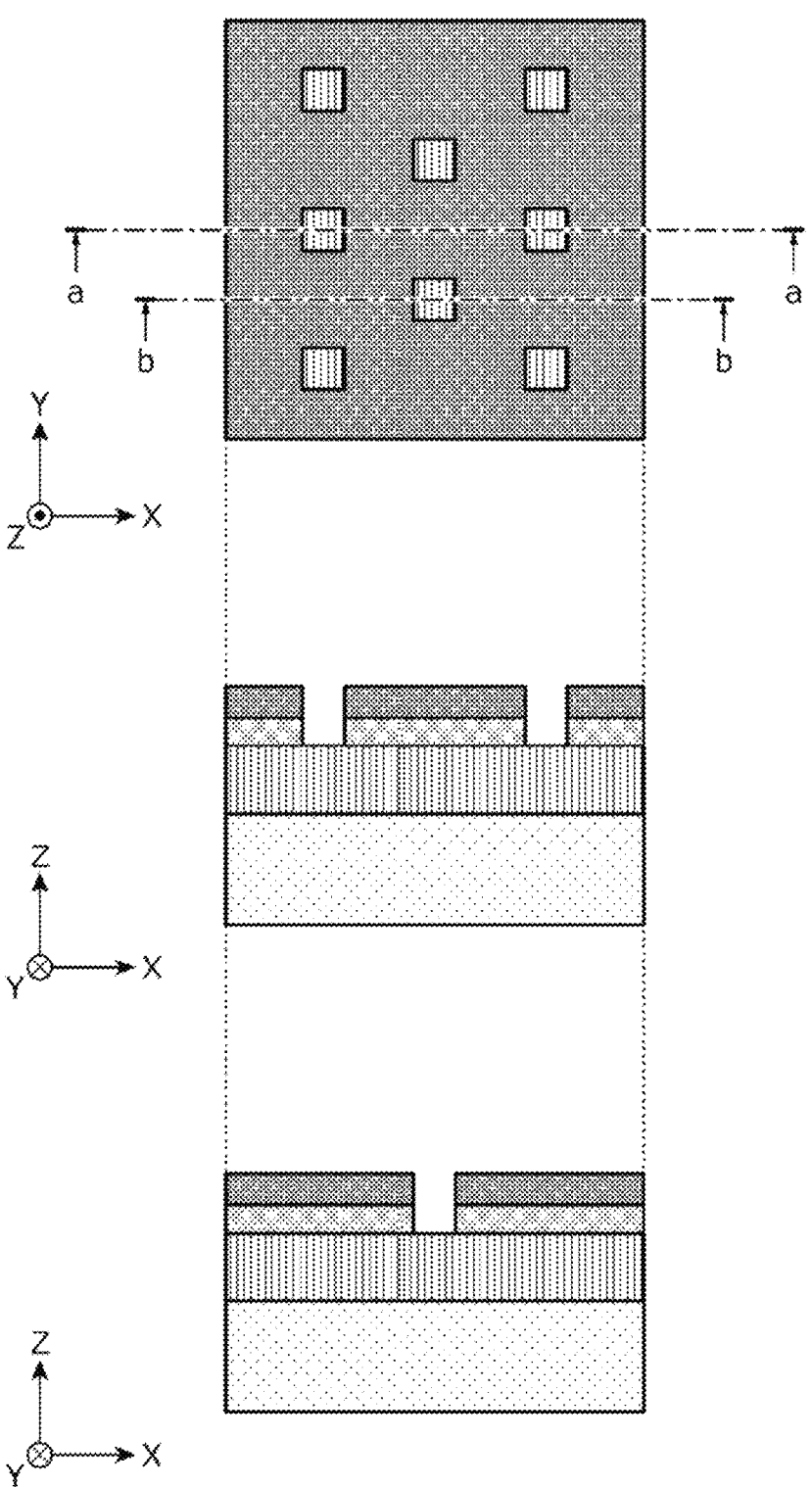

FIG. 11C shows a plan schematic diagram and cross-sectional schematic diagrams illustrating a process of manufacturing the semiconductor device according to Embodiment 2.

Figure 11D:
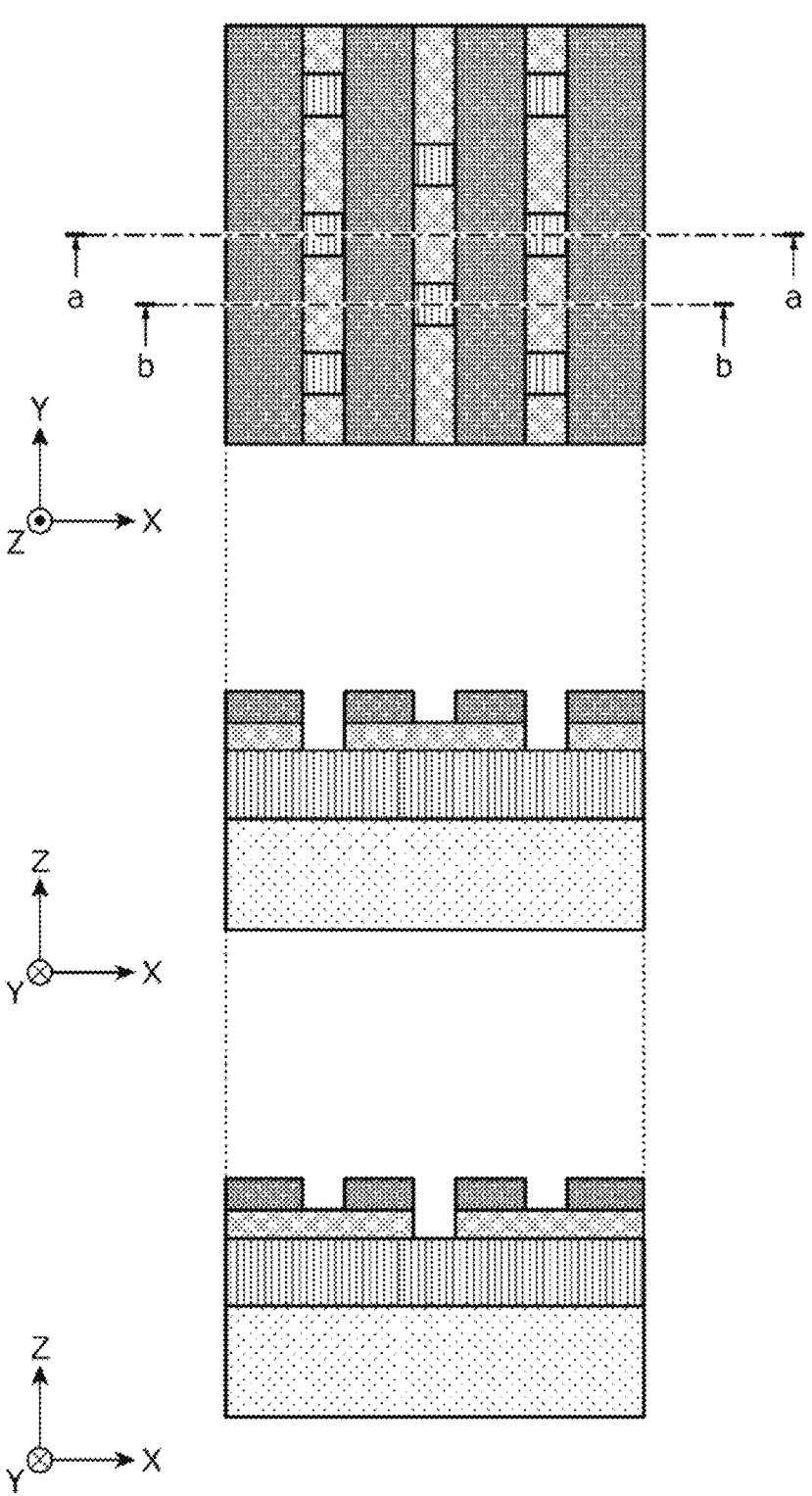

FIG. 11D shows a plan schematic diagram and cross-sectional schematic diagrams illustrating a process of manufacturing the semiconductor device according to Embodiment 2.

Figure 11E:
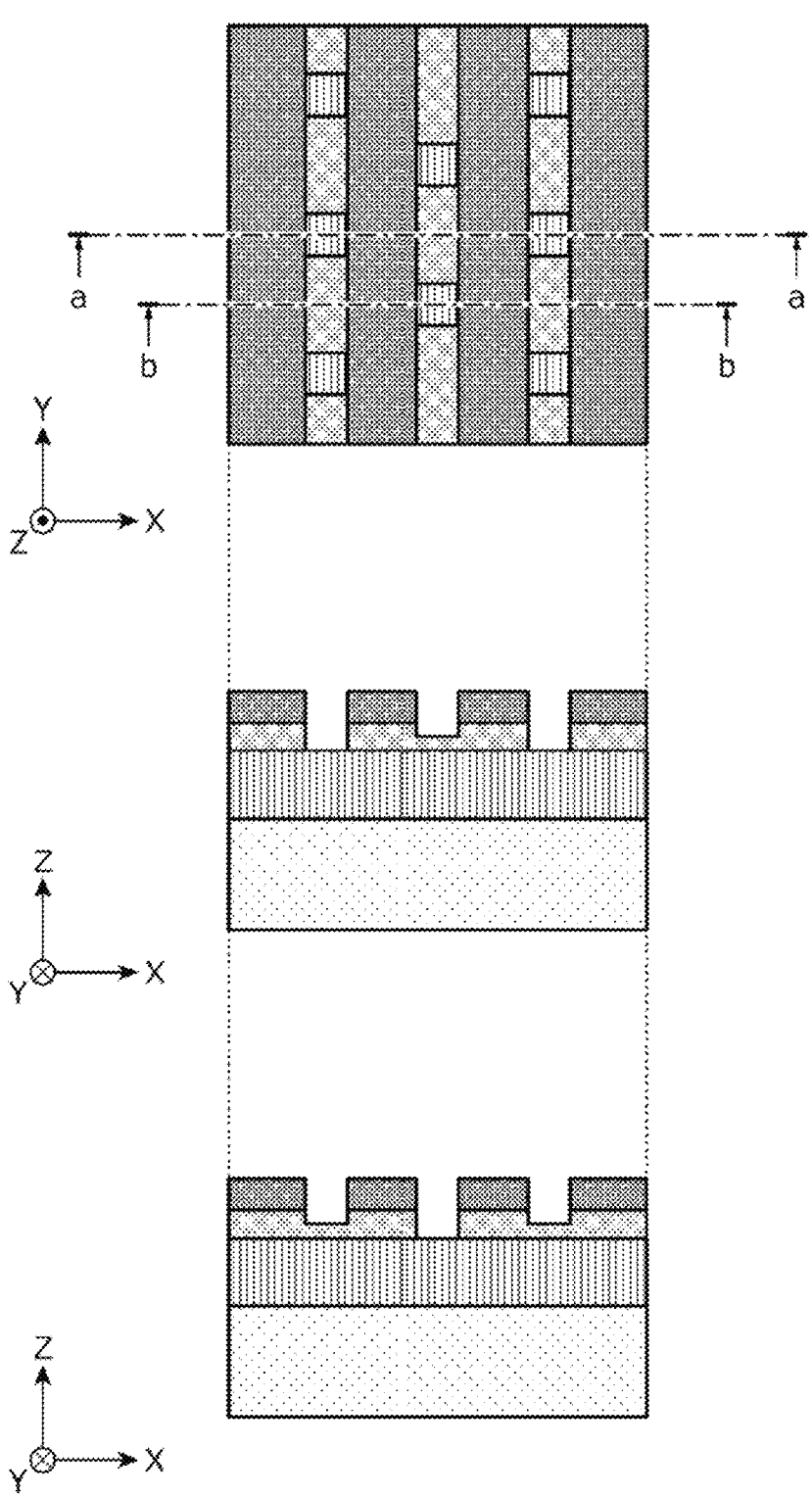

FIG. 11E shows a plan schematic diagram and cross-sectional schematic diagrams illustrating a process of manufacturing the semiconductor device according to Embodiment 2.

Figure 11F:
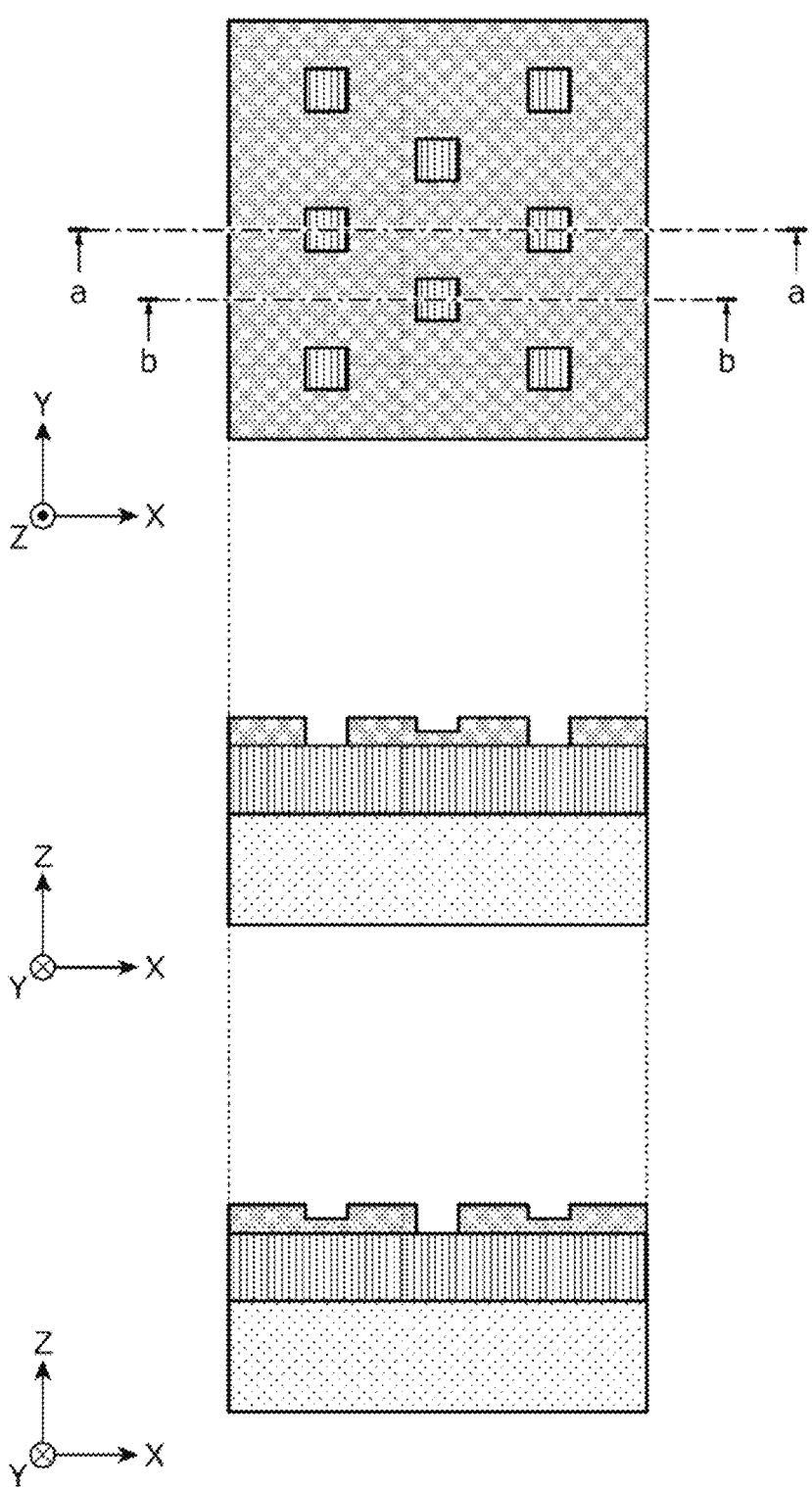

FIG. 11F shows a plan schematic diagram and cross-sectional schematic diagrams illustrating a process of manufacturing the semiconductor device according to Embodiment 2.

Figure 11G:
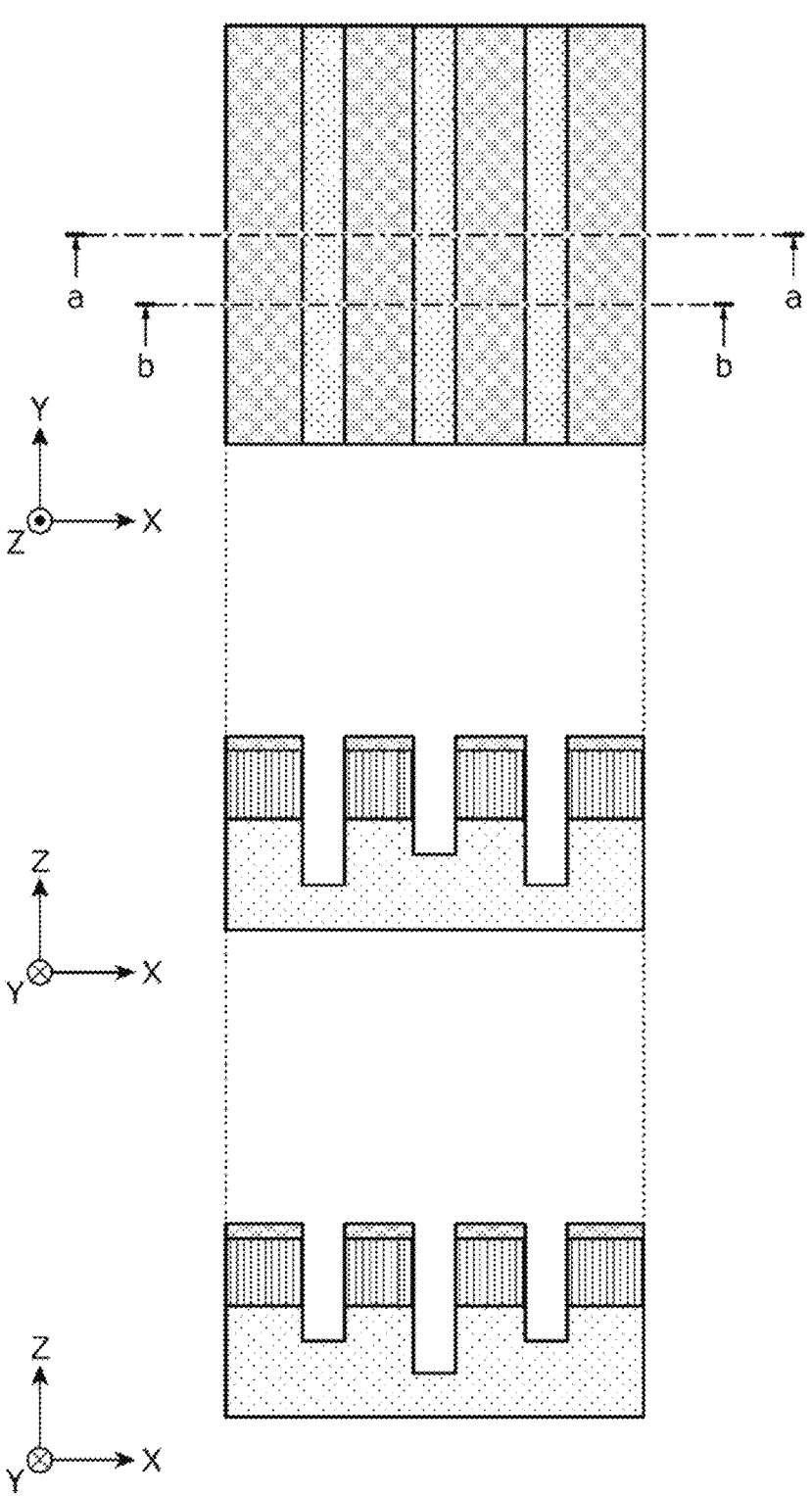

FIG. 11G shows a plan schematic diagram and cross-sectional schematic diagrams illustrating a process of manufacturing the semiconductor device according to Embodiment 2.

Figure 11H:
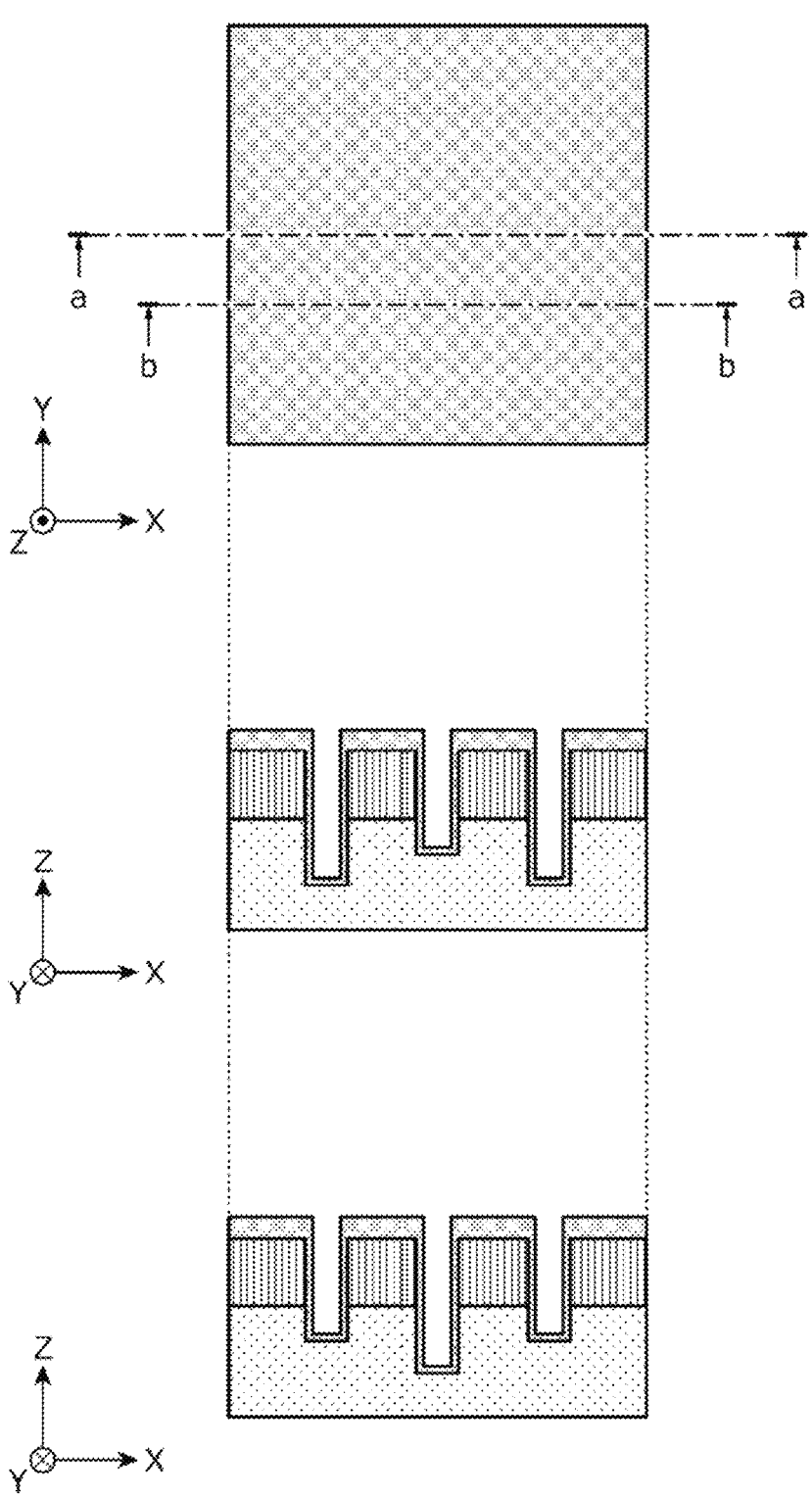

FIG. 11H shows a plan schematic diagram and cross-sectional schematic diagrams illustrating a process of manufacturing the semiconductor device according to Embodiment 2.

Figure 11I:
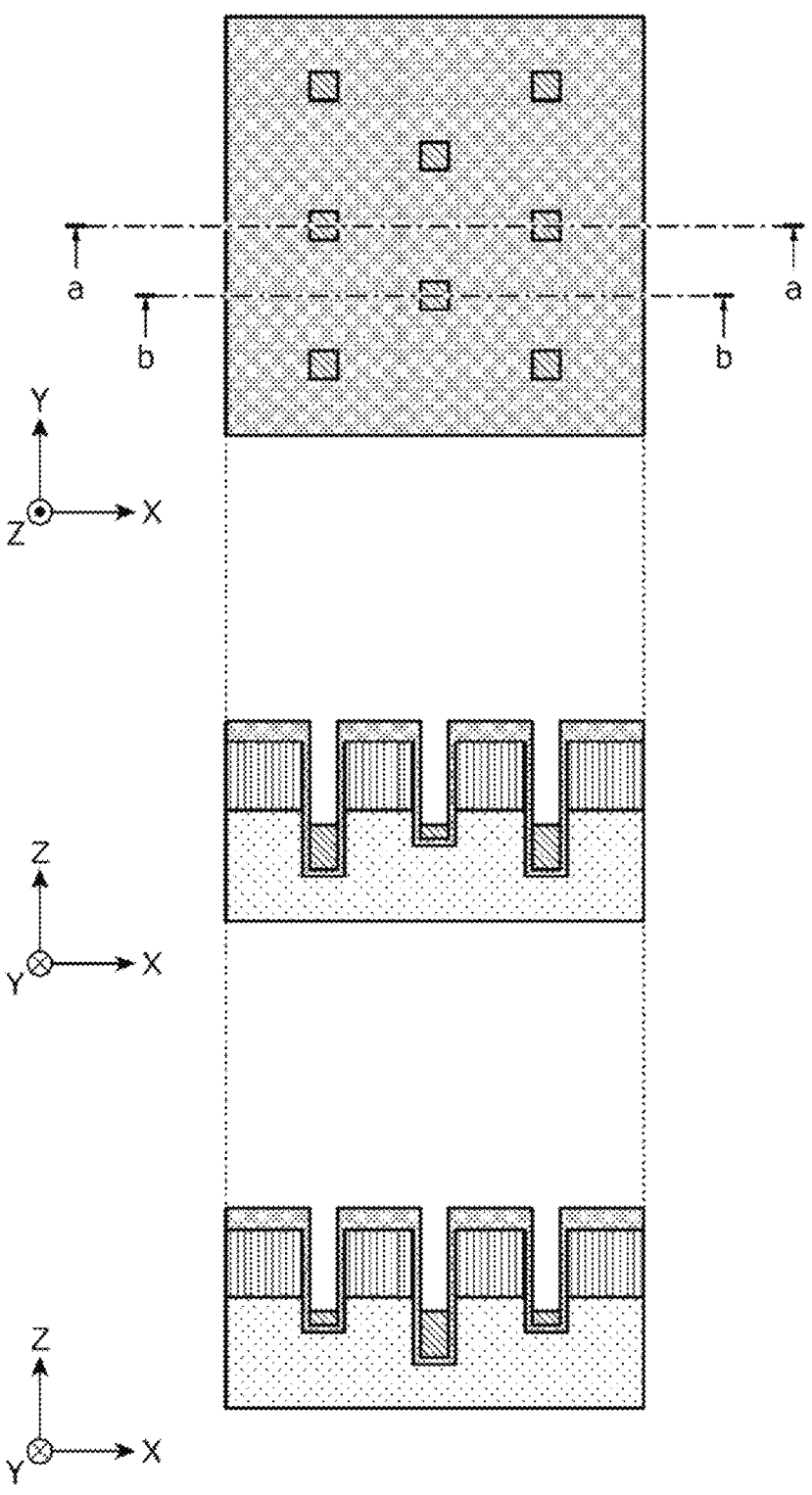

FIG. 11I shows a plan schematic diagram and cross-sectional schematic diagrams illustrating a process of manufacturing the semiconductor device according to Embodiment 2.

Figure 11J:
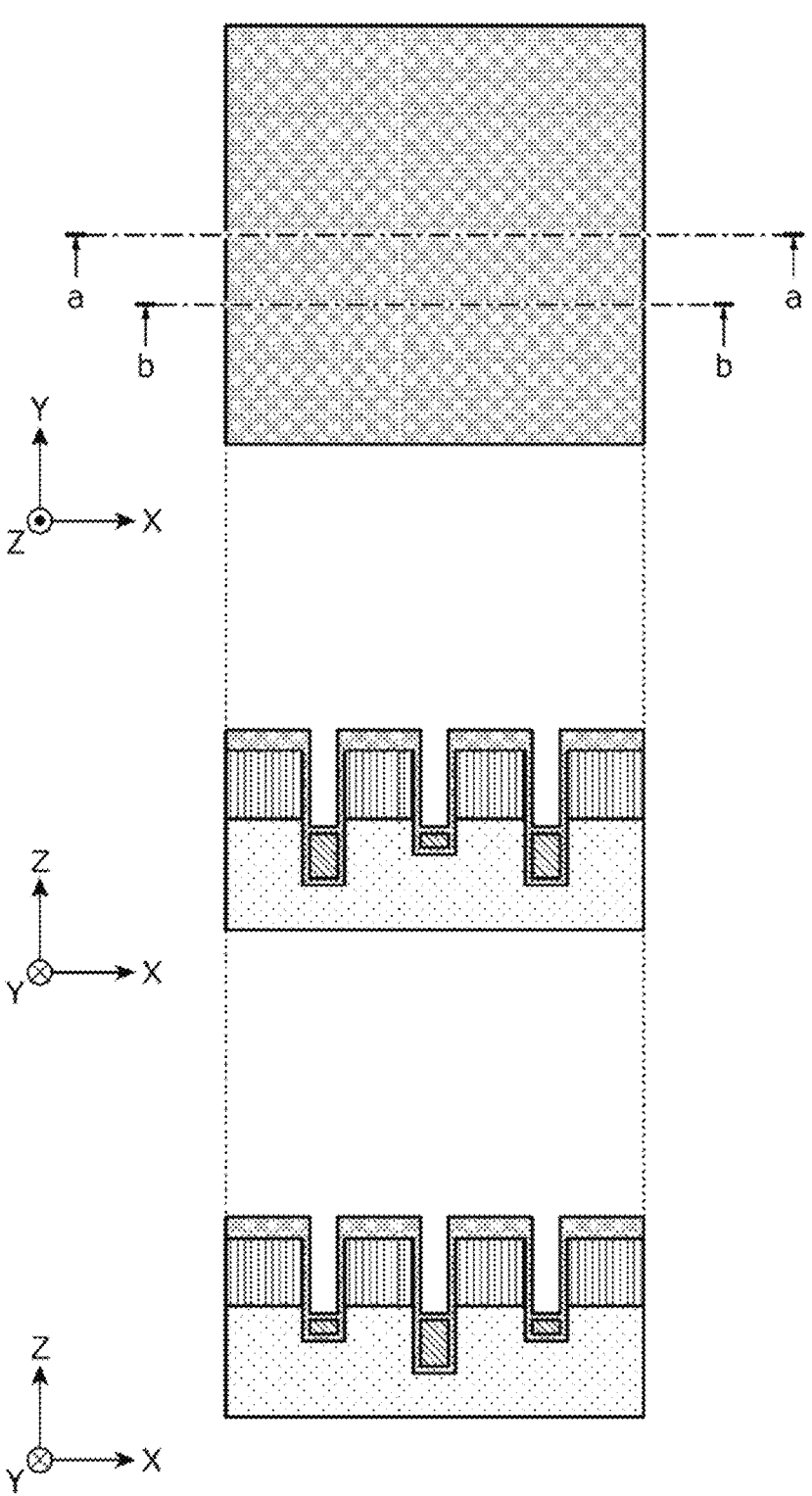

FIG. 11J shows a plan schematic diagram and cross-sectional schematic diagrams illustrating a process of manufacturing the semiconductor device according to Embodiment 2.

Figure 11K:
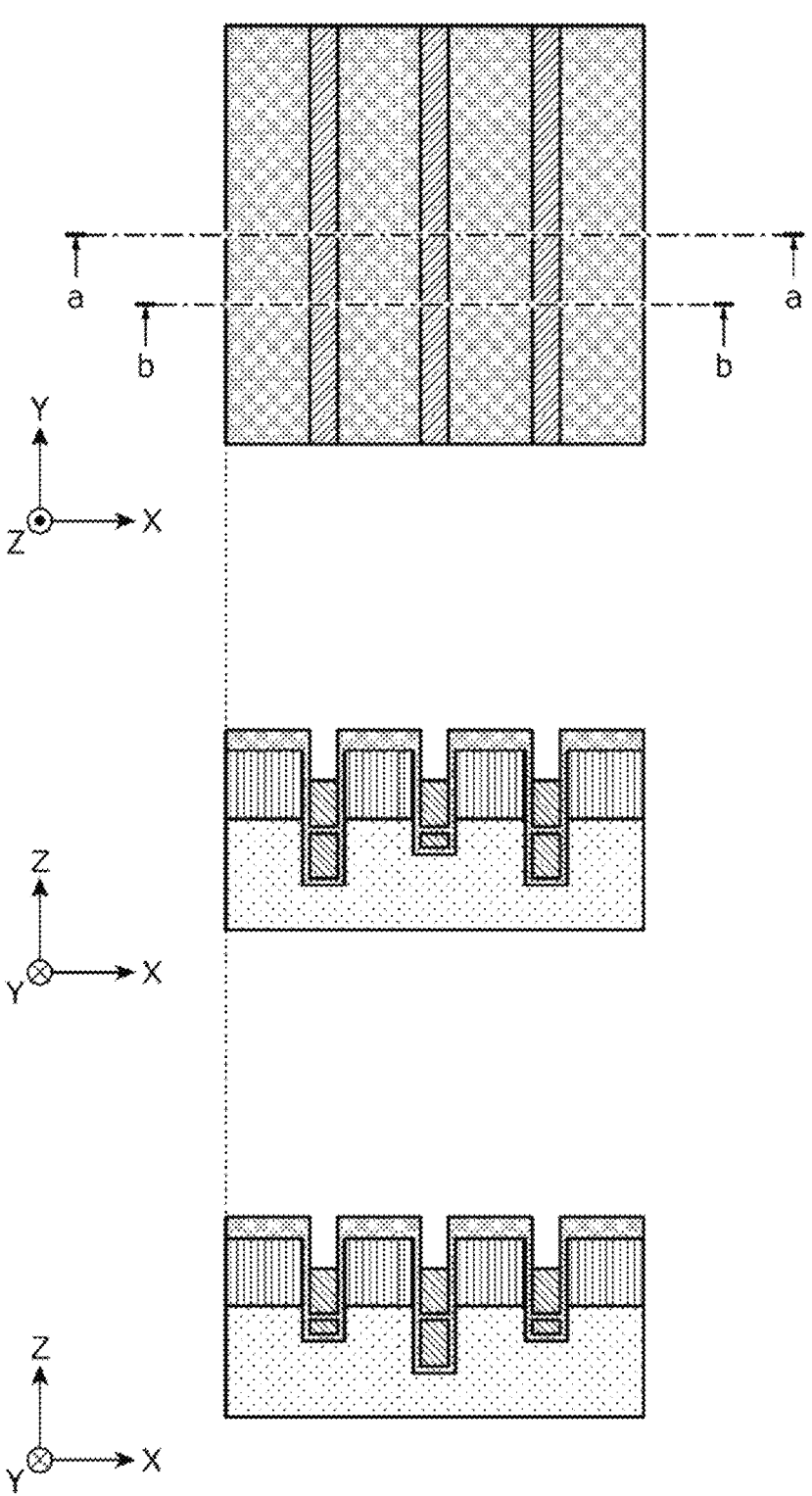

FIG. 11K shows a plan schematic diagram and cross-sectional schematic diagrams illustrating a process of manufacturing the semiconductor device according to Embodiment 2.

Figure 12A:
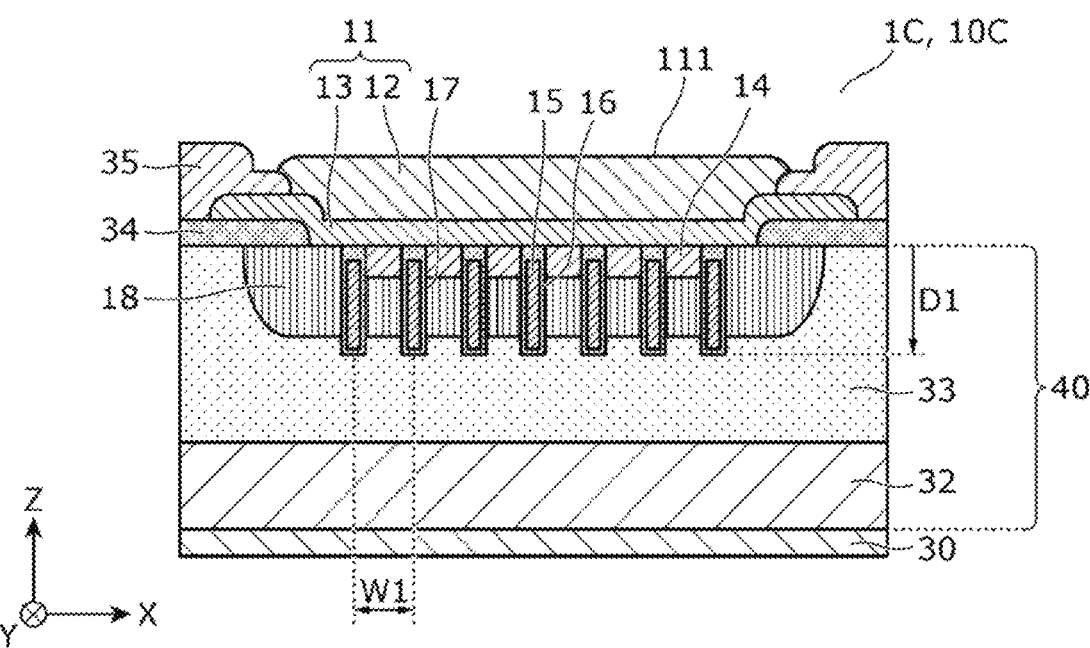

FIG. 12A is a cross-sectional schematic diagram illustrating an example of a structure of a semiconductor device according to Embodiment 3.

Figure 12B:
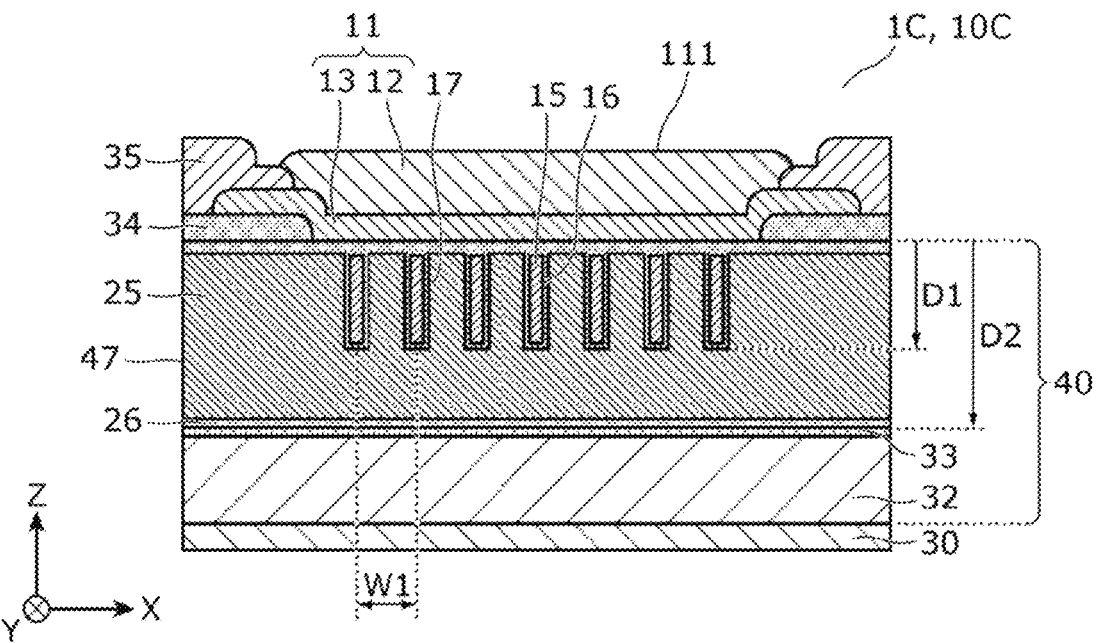

FIG. 12B is a cross-sectional schematic diagram illustrating an example of a structure of the semiconductor device according to Embodiment 3.

Figure 12C:
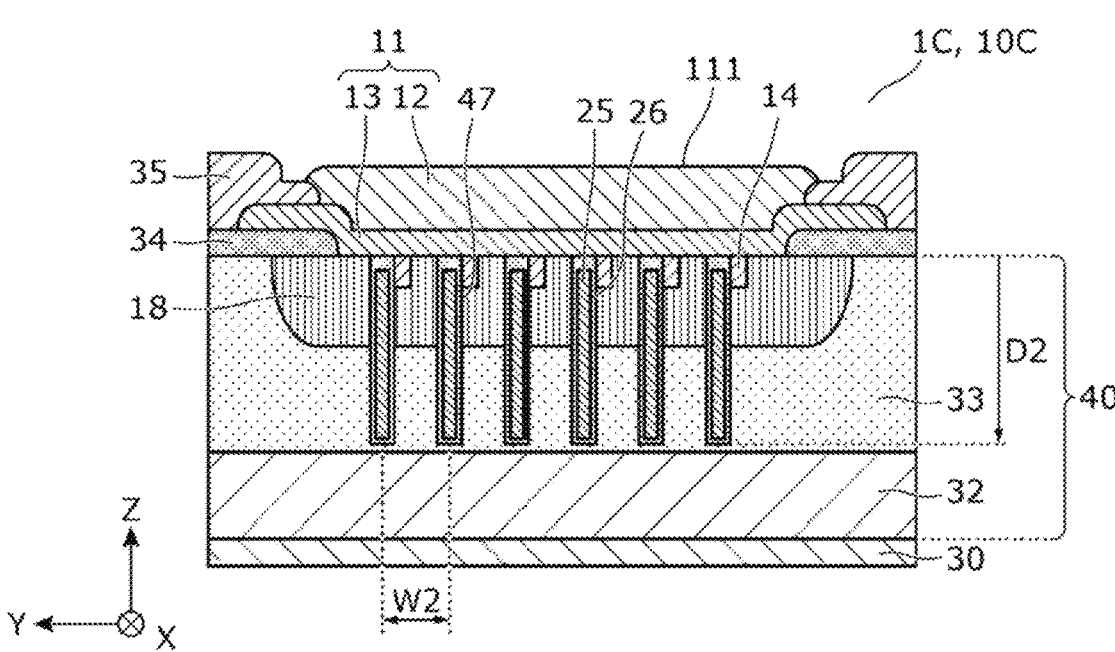

FIG. 12C is a cross-sectional schematic diagram illustrating an example of a structure of the semiconductor device according to Embodiment 3.

Figure 12D:
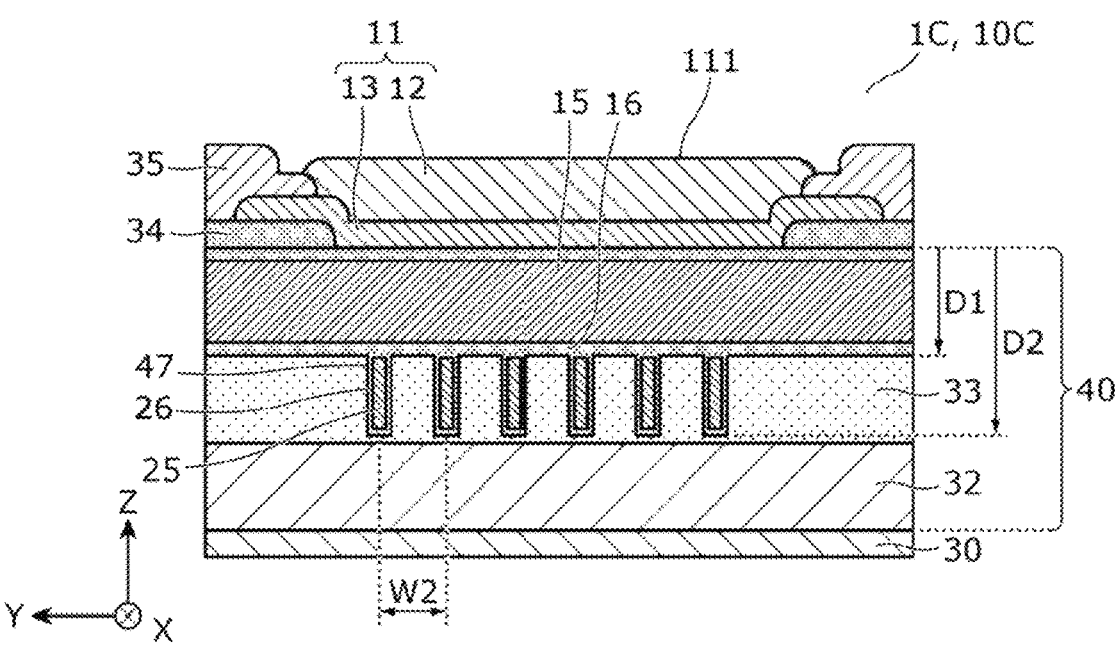

FIG. 12D is a cross-sectional schematic diagram illustrating an example of a structure of the semiconductor device according to Embodiment 3.

Figure 12E:
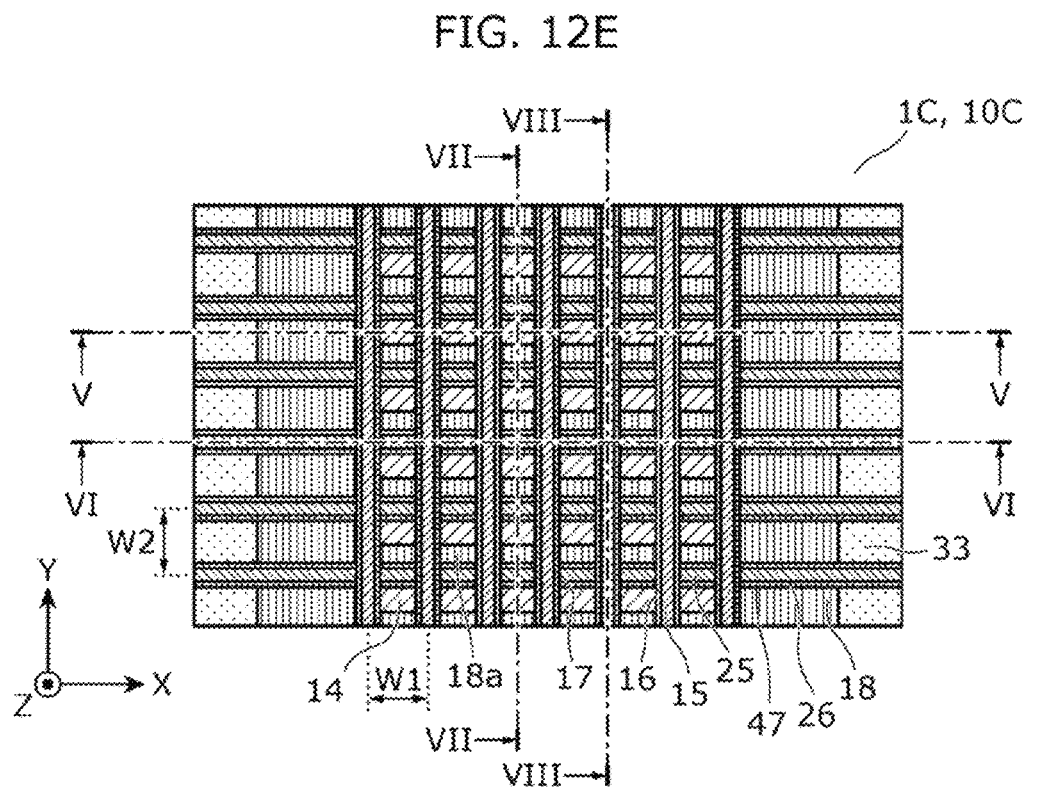

FIG. 12E is a plan schematic diagram illustrating an example of a structure of the semiconductor device according to Embodiment 3.

Figure 13A:
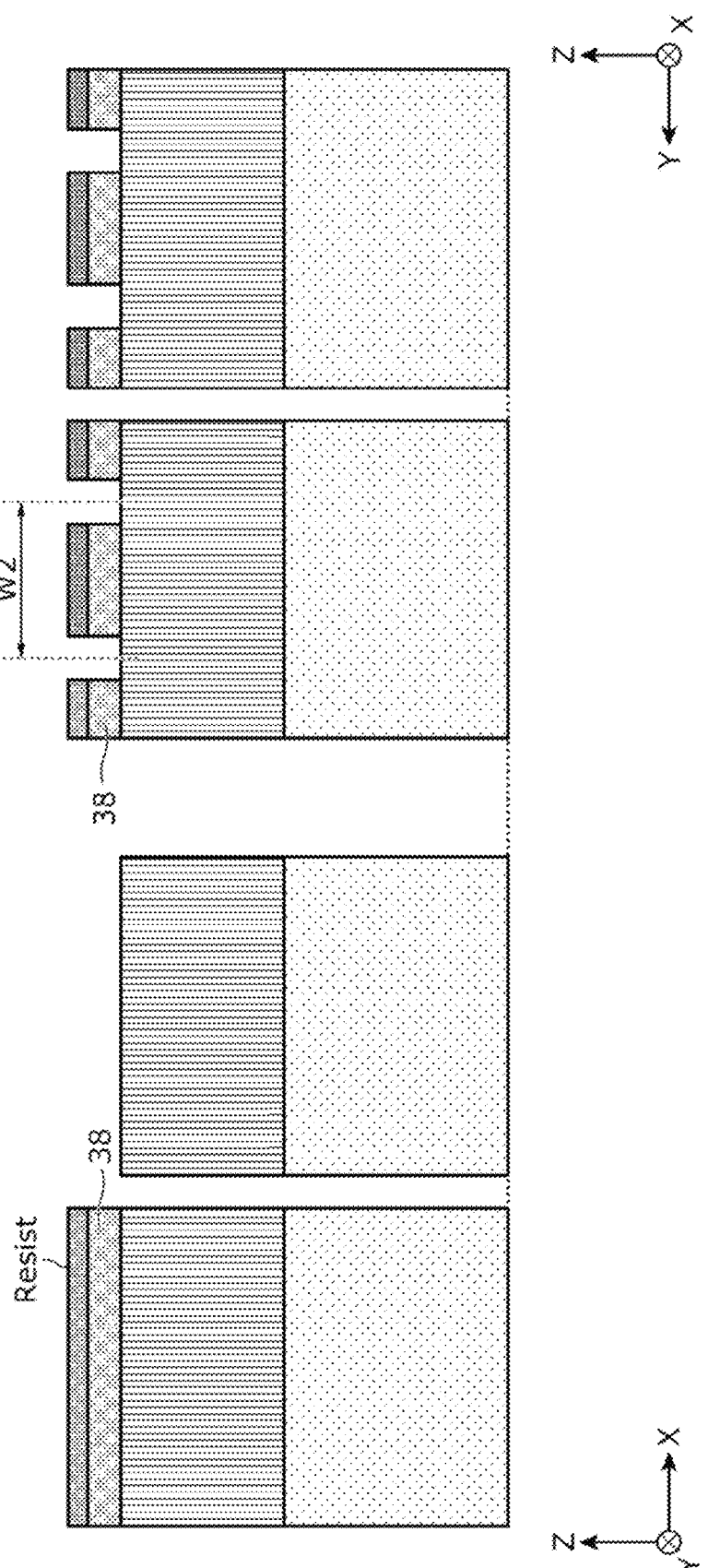

FIG. 13A shows cross-sectional schematic diagrams illustrating a process of manufacturing the semiconductor device according to Embodiment 3.

Figure 13B:
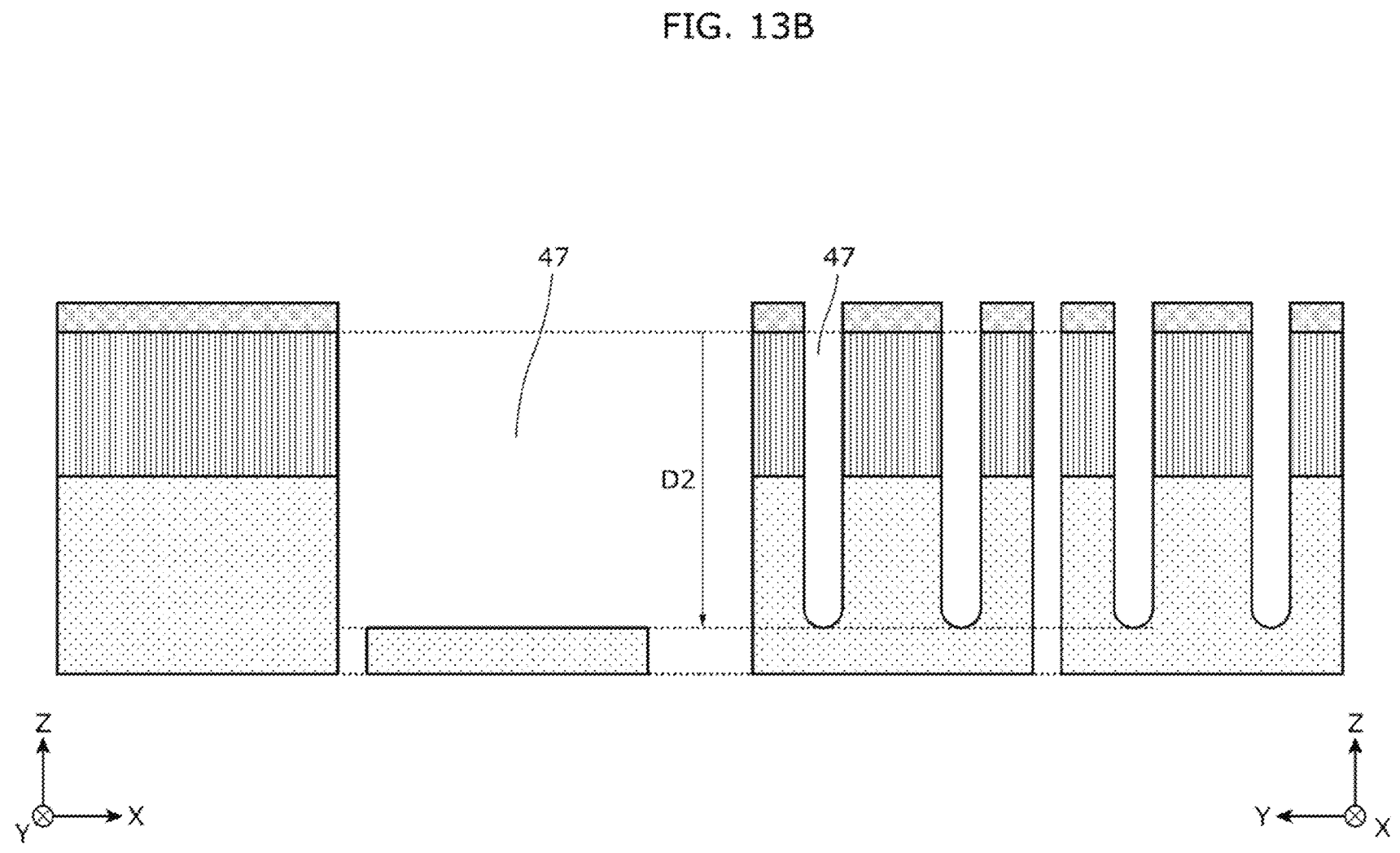

FIG. 13B shows cross-sectional schematic diagrams illustrating a process of manufacturing the semiconductor device according to Embodiment 3.

Figure 13C:
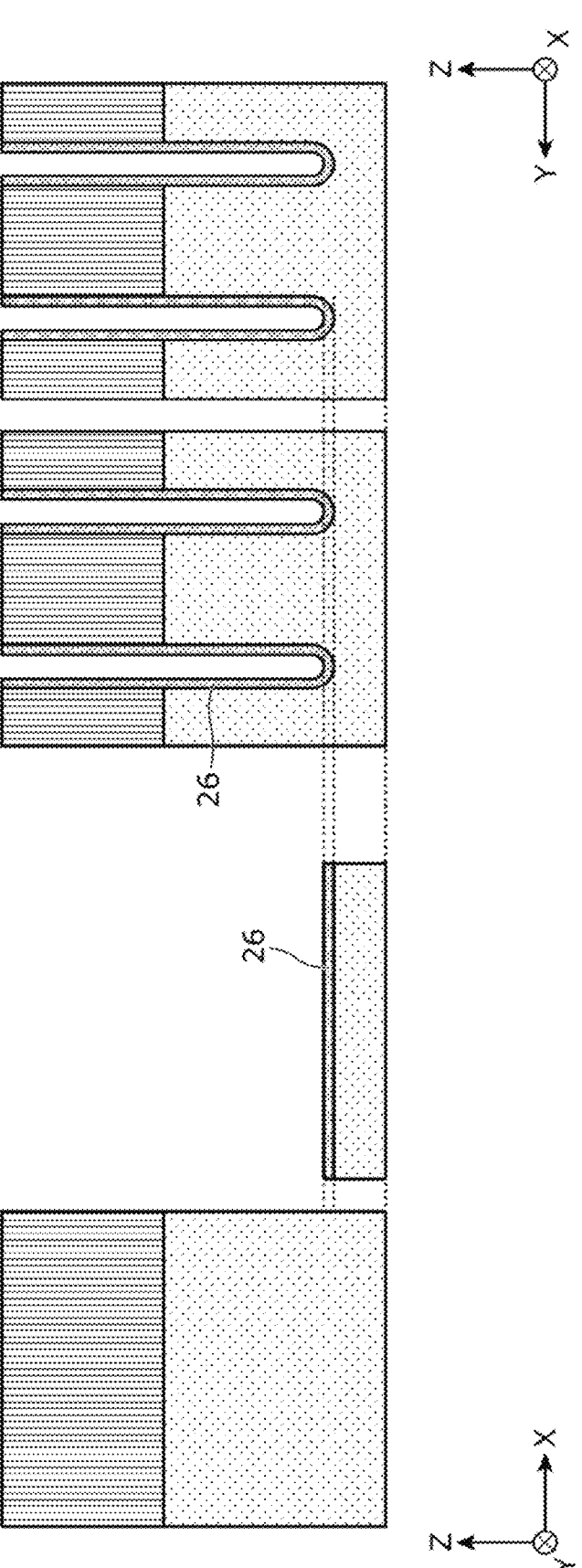

FIG. 13C shows cross-sectional schematic diagrams illustrating a process of manufacturing the semiconductor device according to Embodiment 3.

Figure 13D:
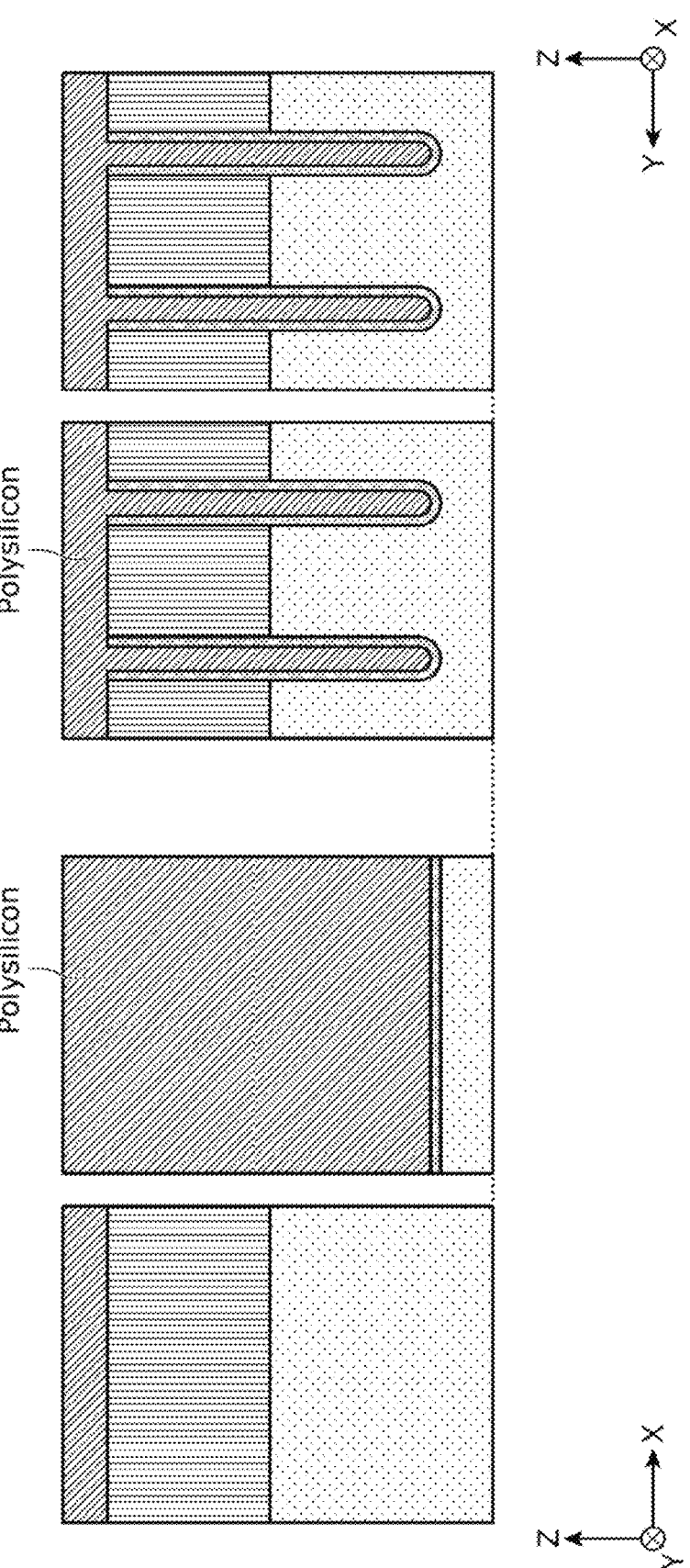

FIG. 13D shows cross-sectional schematic diagrams illustrating a process of manufacturing the semiconductor device according to Embodiment 3.

Figure 13E:
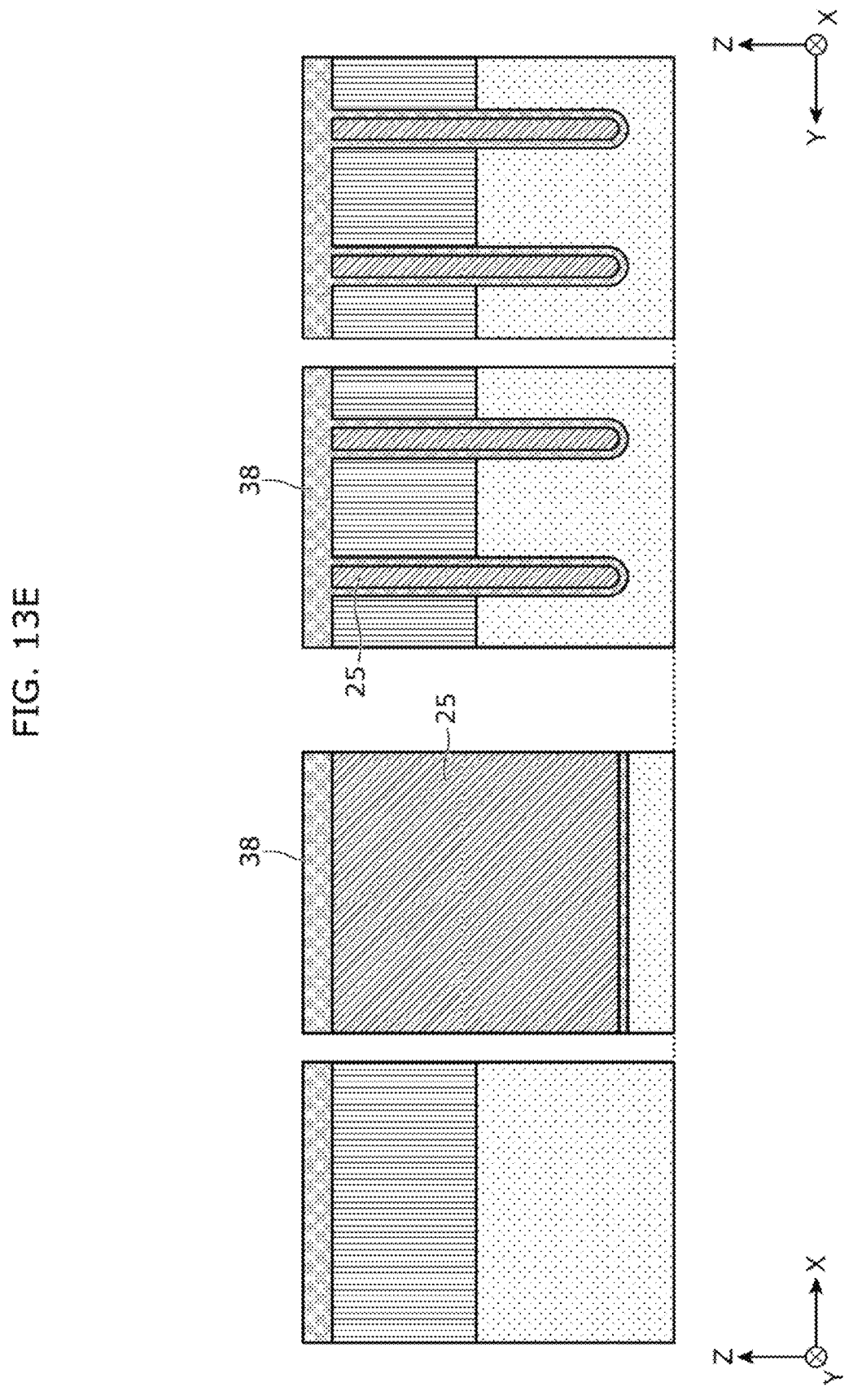

FIG. 13E shows cross-sectional schematic diagrams illustrating a process of manufacturing the semiconductor device according to Embodiment 3.

Figure 13F:
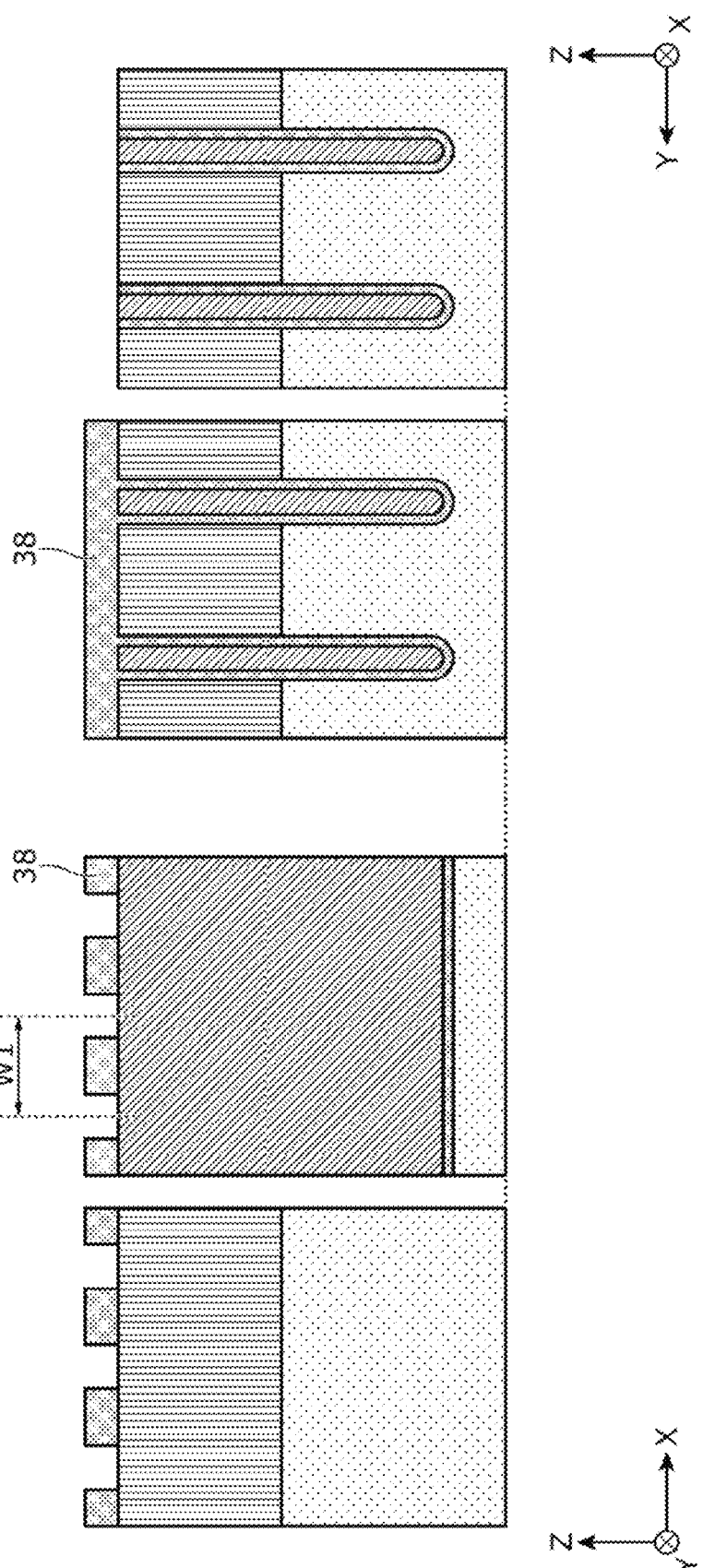

FIG. 13F shows cross-sectional schematic diagrams illustrating a process of manufacturing the semiconductor device according to Embodiment 3.

Figure 13G:
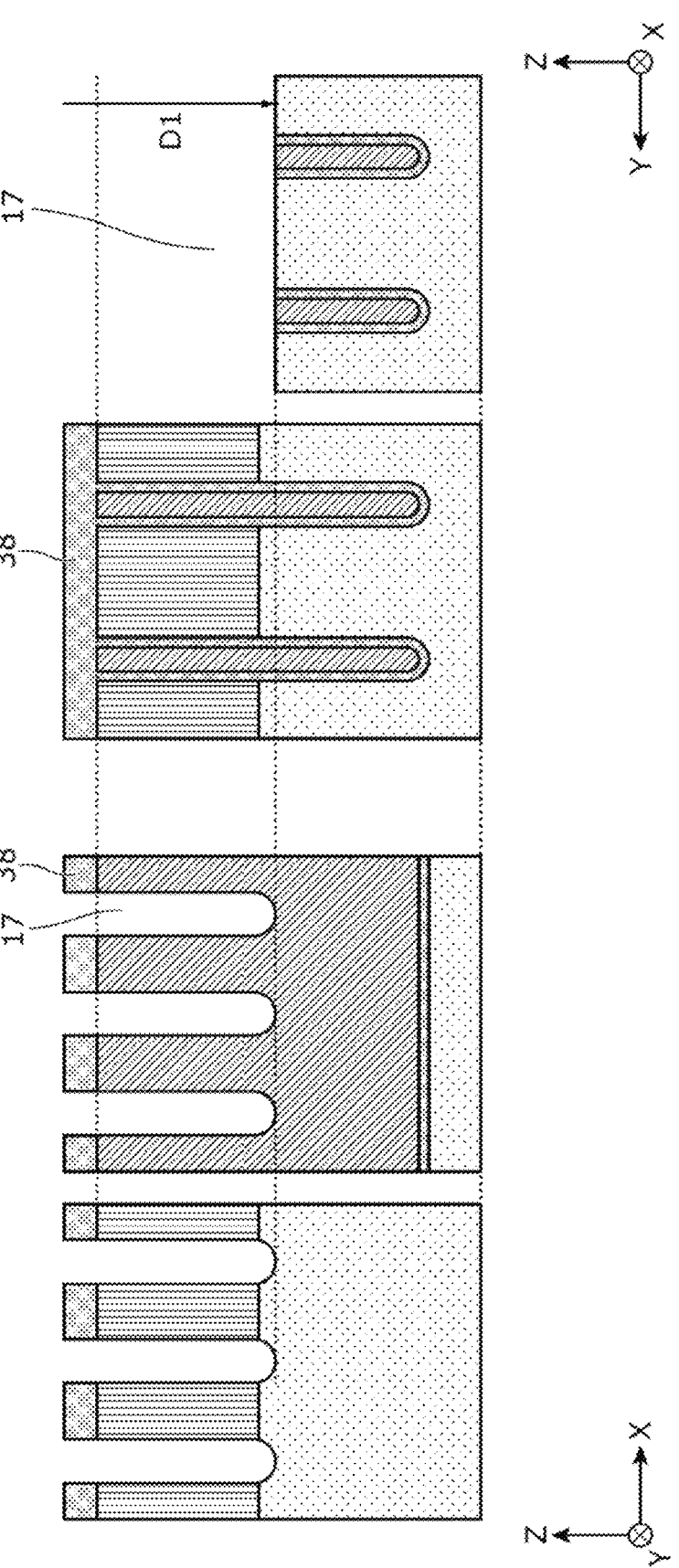

FIG. 13G shows cross-sectional schematic diagrams illustrating a process of manufacturing the semiconductor device according to Embodiment 3.

Figure 13H:
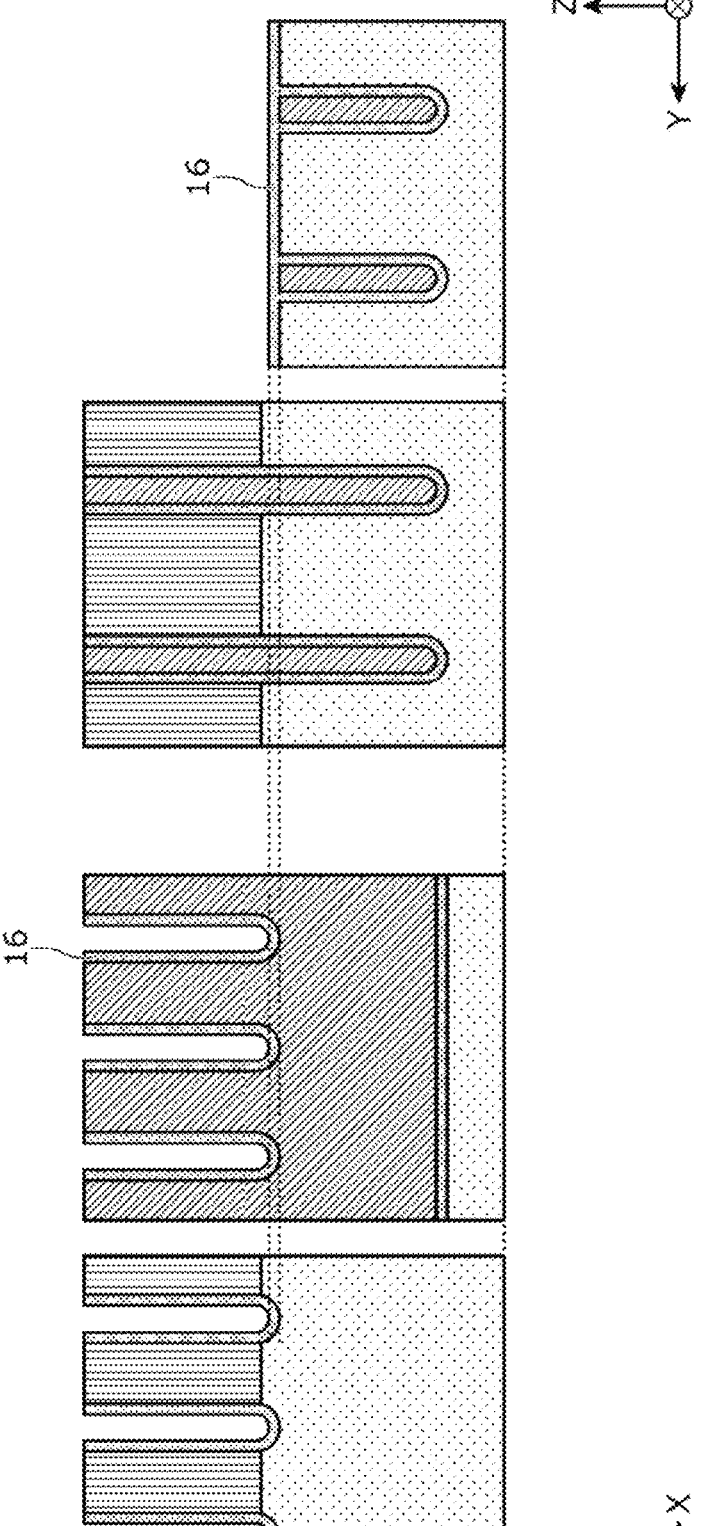

FIG. 13H shows cross-sectional schematic diagrams illustrating a process of manufacturing the semiconductor device according to Embodiment 3.

Figure 13I:
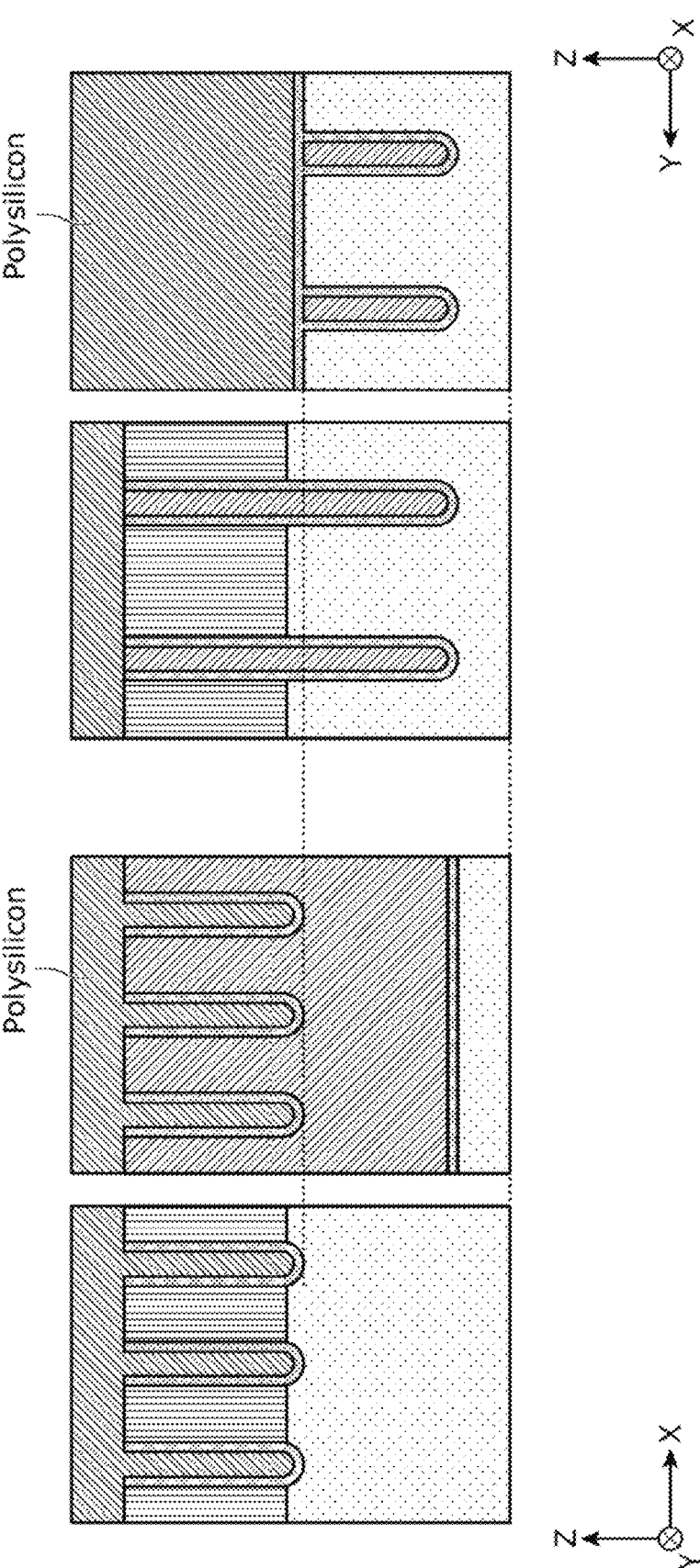

FIG. 13I shows cross-sectional schematic diagrams illustrating a process of manufacturing the semiconductor device according to Embodiment 3.

Figure 13J:
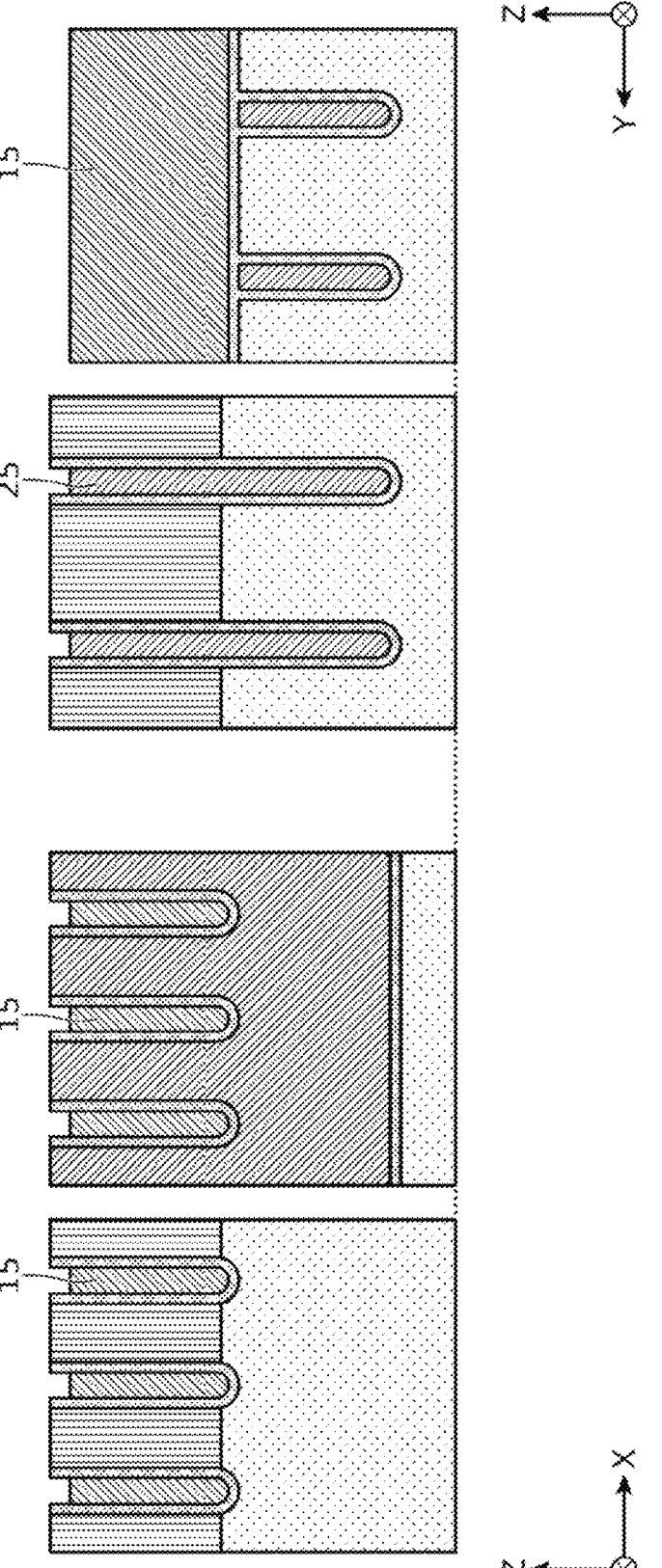

FIG. 13J shows cross-sectional schematic diagrams illustrating a process of manufacturing the semiconductor device according to Embodiment 3.

Figure 13K:
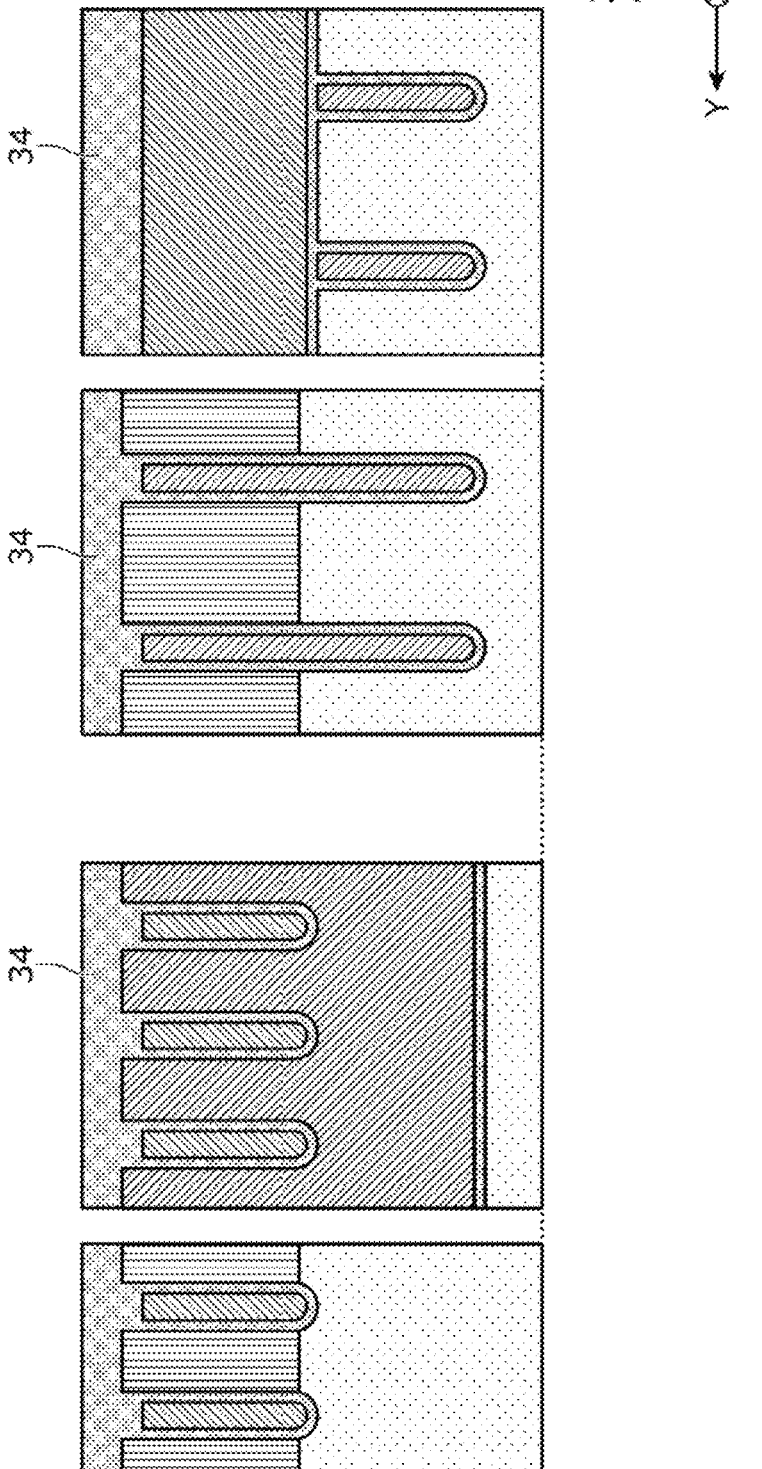

FIG. 13K shows cross-sectional schematic diagrams illustrating a process of manufacturing the semiconductor device according to Embodiment 3.

Figure 14A:
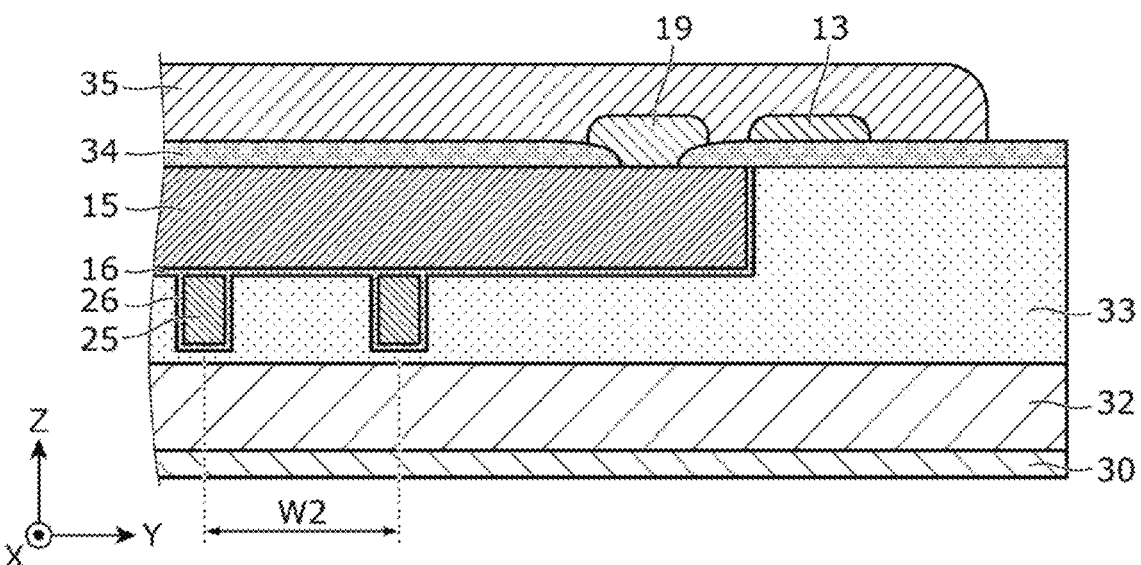

FIG. 14A is a cross-sectional schematic diagram illustrating an example of a structure of the semiconductor device according to Embodiment 3.

Figure 14B:
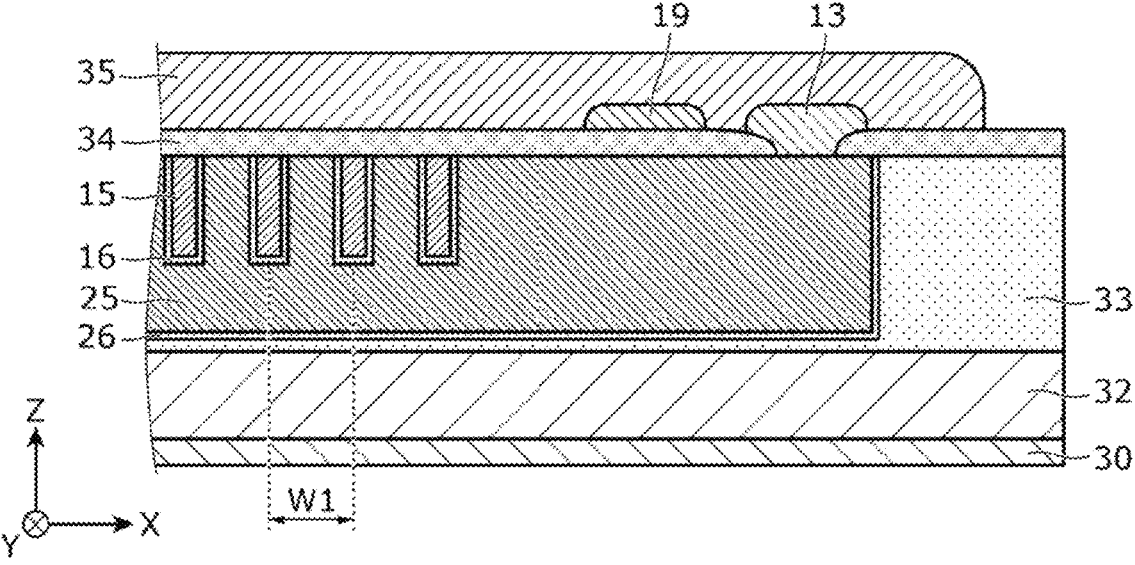

FIG. 14B is a cross-sectional schematic diagram illustrating an example of a structure of the semiconductor device according to Embodiment 3.

DESCRIPTION OF EMBODIMENTS

In the following, specific examples of a semiconductor device according to aspects of the present disclosure are described with reference to the drawings. The embodiments shown herein show specific examples of the present disclosure. The numerical values, shapes, elements, the arrangement and connection of the elements indicated in the following embodiments are examples, and are therefore not intended to limit the present disclosure. The drawings are schematic diagrams, and do not necessarily provide strictly accurate illustration. Throughout the drawings, the same reference sign is given to substantially the same element, and redundant description is omitted or simplified.

Embodiment 1

[1. Structure of Semiconductor Device]

Figure 1A:
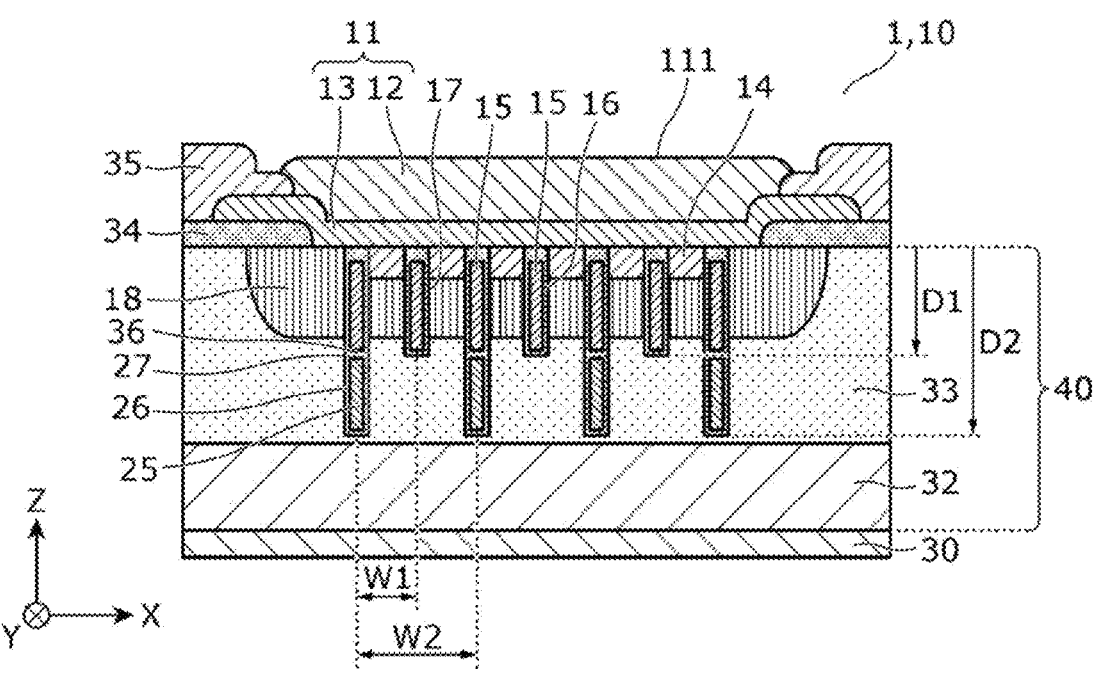
FIG. 1A is a cross-sectional schematic diagram illustrating an example of a structure of a semiconductor device according to Embodiment 1.
Figure 1B:
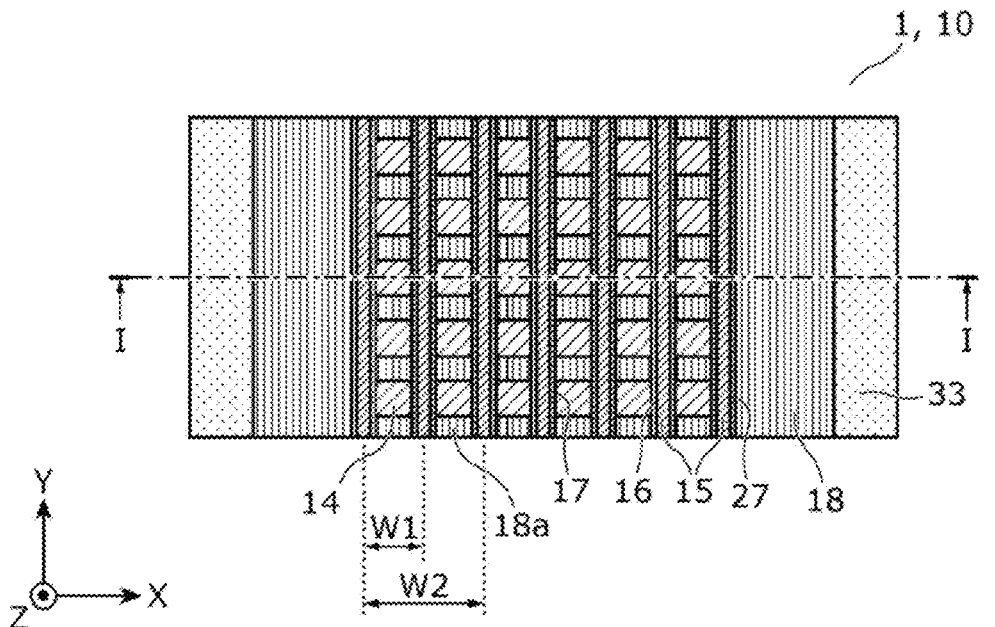
FIG. 1B is a plan schematic diagram illustrating an example of a structure of the semiconductor device according to Embodiment 1.

FIG. 1A is a cross-sectional schematic diagram illustrating an example of a structure of semiconductor device 1 according to Embodiment 1. FIG. 1B is a plan schematic diagram thereof, and FIG. 1A illustrates a cut surface when semiconductor device 1 is cut along I-I in FIG. 1B. Note that FIG. 1B gives illustration as if passivation layer 35, interlayer insulating layer 34, and source electrode 11 to be described later were transparent so that the structure thereunder is seen through and visible.

As illustrated in FIG. 1A and FIG. 1B, semiconductor device 1 includes semiconductor substrate 32, metal layer 30, and low-concentration impurity layer 33 provided above semiconductor substrate 32. In the present disclosure, a combination of semiconductor substrate 32 and low-concentration impurity layer 33 is referred to as semiconductor layer 40.

Semiconductor substrate 32 is disposed on the back surface side of semiconductor layer 40, and comprises silicon of a first conductivity type that includes impurities. Low-concentration impurity layer 33 is disposed on the front surface side of semiconductor layer 40, is provided in contact with semiconductor substrate 32, includes impurities having a lower concentration than a predetermined concentration of the impurities of semiconductor substrate 32, and is of the first conductivity type. Low-concentration impurity layer 33 may be provided above semiconductor substrate 32 by epitaxial growth, for example.

As illustrated in FIG. 1A, semiconductor device 1 includes vertical metal-oxide semiconductor (MOS) transistor 10 (hereinafter, also referred to as "transistor 10") provided in semiconductor layer 40.

Metal layer 30 is provided in contact with the back surface of semiconductor layer 40 (semiconductor substrate 32), and comprises silver (Ag) or copper (Cu), for example. Note that metal layer 30 may include a trace amount of an element other than metal, which is mixed as an impurity in a process of manufacturing the metal material. Metal layer 30 may be or may not be provided on the entire back surface of semiconductor layer 40 (semiconductor substrate 32). The thickness of metal layer 30 is at least 3 μm and at most 50 μm, as an example.

As illustrated in FIG. 1A and FIG. 1B, body region 18 of a second conductivity type different from the first conductivity type is provided in semiconductor layer 40 (low-concentration impurity layer 33). Source regions 14 of the first conductivity type are provided in an upper portion of body region 18.

A plurality of first trenches 17 penetrating through source regions 14 and body region 18 from the upper surface of semiconductor layer 40 to reach depth D1 [μm] up to a portion of low-concentration impurity layer 33 are provided. Similarly, a plurality of second trenches 27 penetrating through source regions 14 and body region 18 from the upper surface of semiconductor layer 40 to reach depth D2 [μm] up to a portion of low-concentration impurity layer 33 are provided. D2 is greater than D1 (D1<D2).

First trenches 17 and second trenches 27 both extend in the Y direction and are aligned in the X direction parallel to one another. The Y direction is a direction that is parallel to the upper surface of semiconductor layer 40 and in which first trenches 17 extend. The X direction is a direction that is parallel to the upper surface of semiconductor layer 40 and orthogonal to the Y direction. Note that the Z direction refers to a direction that is orthogonal to both the X direction and the Y direction and indicates the height direction of the semiconductor device. In the present disclosure, the Y direction may be expressed as a first direction, the X direction may be expressed as a second direction, and the Z direction may be expressed as a third direction.

First trenches 17 and second trenches 27 are alternately disposed in stripes at regular pitch W1 [μm] in the X direction.

Gate insulating film 16 is provided on the inner surfaces of first trenches 17, and gate conductor 15 is provided on gate insulating film 16 inside each of first trenches 17. Gate conductors 15 are embedded electrodes that are embedded in semiconductor layer 40. Since only gate conductors 15 are provided in first trenches 17, first trenches 17 may also be referred to as gate trenches 17.

Second trenches 27 have a so-called split-type structure. In each of second trenches 27, gate conductor 15 is embedded in an upper portion thereof, and shield conductor 25 is embedded in a lower portion thereof. Since shield conductors 25 are provided in second trenches 27, second trenches 27 may also referred to as shield trenches 27.

Shield insulating film 26 is provided on the inner surfaces of second trenches 27 at positions deeper than first trenches 17, and shield conductor 25 is provided on shield insulating film 26 in each of second trenches 27. Shield conductors 25 are embedded electrodes that are embedded in semiconductor layer 40.

Intermediate insulating film 36 is provided above shield conductor 25 and shield insulating film 26, inside each of second trenches 27. The position at which intermediate insulating film 36 is provided coincides with the position at depth D1 from the upper surface of semiconductor layer 40. Stated differently, shield conductors 25 are provided inside second trenches 27 at only positions deeper than first trenches 17.

Gate insulating film 16 is provided inside second trenches 27 on the inner surfaces (portions of side surfaces) at positions shallower than depth D1 (above intermediate insulating film 36), and gate conductors 15 are provided above intermediate insulating film 36 inside second trenches 27. Similarly to the case of first trenches 17, gate conductors 15 are embedded electrodes that are embedded in semiconductor layer 40, also in second trenches 27.

Gate conductors 15 are provided in both first trenches 17 and second trenches 27. Thus, gate conductors 15 are disposed at a regular pitch of W1 [μm] in the X direction. In contrast, shield conductors 25 are provided only in second trenches 27. Shield conductors 25 are disposed at a regular pitch of W2 [μm] in the X direction, and thus W1=W2/2 is satisfied.

Figure 2A:
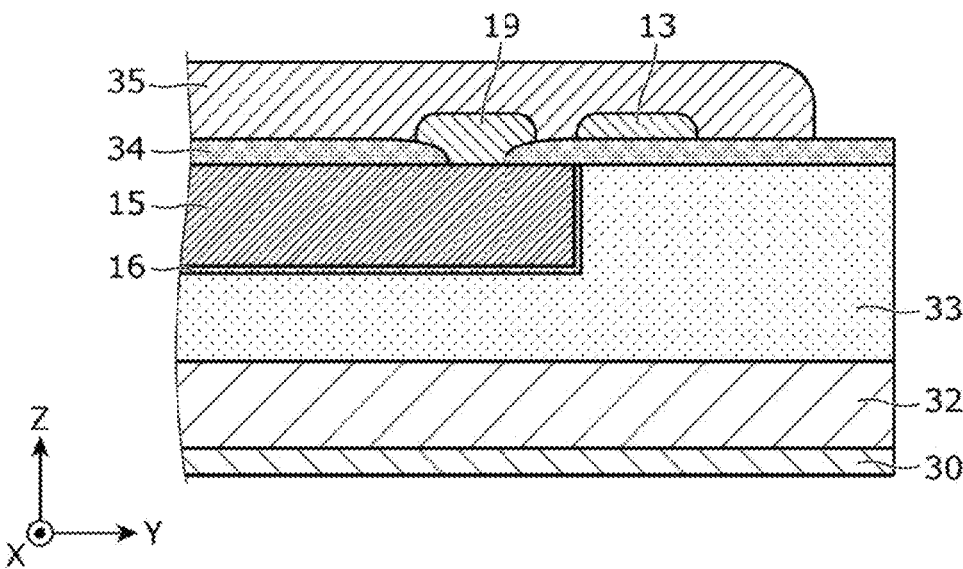
FIG. 2A is a cross-sectional schematic diagram illustrating an example of a structure of the semiconductor device according to Embodiment 1.
Figure 2B:
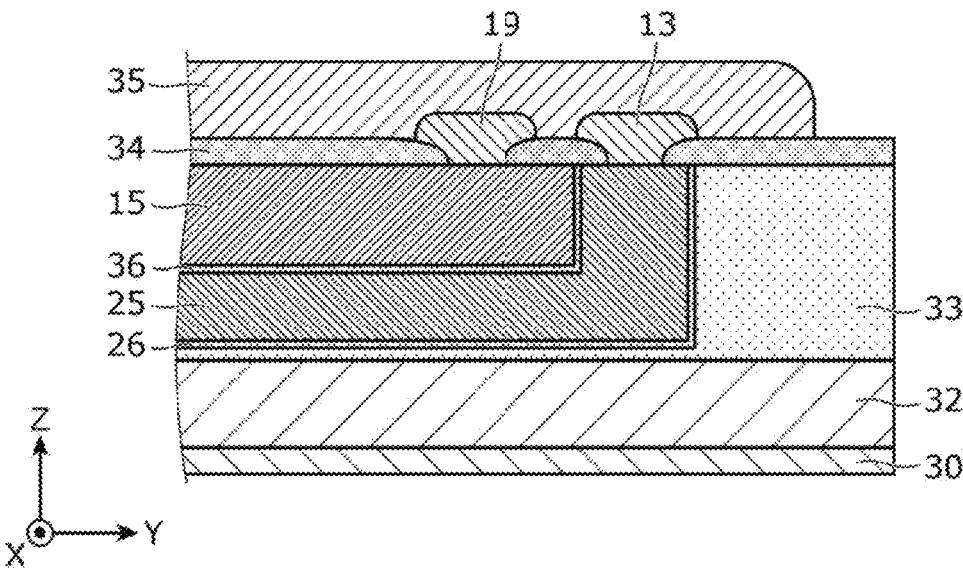
FIG. 2B is a cross-sectional schematic diagram illustrating an example of a structure of the semiconductor device according to Embodiment 1.

FIG. 2A is a cross-sectional schematic diagram along the YZ plane at a portion in which one of first trenches 17 extends in the Y direction and ends. FIG. 2B is a cross-sectional schematic diagram along the YZ plane at a portion in which one of second trenches 27 extends in the Y direction and ends.

Gate conductors 15 provided inside first trenches 17 and gate conductors 15 provided inside second trenches 27 are both connected to gate electrode 19 (illustrated in FIG. 3B), which is illustrated in FIG. 2A and FIG. 2B, and have the same electric potential as the electric potential of gate electrode 19. Shield conductors 25 provided in second trenches 27 are connected to portion 13 of source electrode 11 illustrated in FIG. 1A and FIG. 2B, and have the same electric potential as the electric potential of source electrode 11.

Source electrode 11 includes portion 12 and portion 13, and portion 12 is connected to source regions 14 and body region 18 and further to shield conductors 25 via portion 13. Portion 12 of source electrode 11 is a layer bonded to solder at the time of reflow when semiconductor device 1 is mounted facedown, and may comprise, as a non-limiting example, a metal material that contains at least one of nickel, titanium, tungsten, or palladium. The surface of portion 12 may be plated with gold, for instance.

Portion 13 of source electrode 11 is a layer that connects portion 12 and semiconductor layer 40, and may comprise, as a non-limiting example, a metal material that contains at least one of aluminum, copper, gold, or silver. The thickness of source electrode 11, which is a combination of portion 12 and portion 13, is at least 2 μm and at most 13 μm, for example.

With the above configuration of transistor 10, semiconductor substrate 32 functions as a drain region of transistor 10. A portion of low-concentration impurity layer 33 on a side in contact with semiconductor substrate 32 may also function as a drain region. Note that low-concentration impurity layer 33 is also a drift layer of transistor 10, and may also be referred to as drift layer 33 in this Specification.

Metal layer 30 functions as a drain electrode of transistor 10. Accordingly, metal layer 30 is also referred to as drain electrode 30 in the following.

As illustrated in FIG. 1A, body region 18 is covered with interlayer insulating layer 34 having an opening, and portion 13 of source electrode 11 connected to source regions 14 is provided through the opening of interlayer insulating layer 34. Interlayer insulating layer 34 and portion 13 of source electrode 11 are covered with passivation layer 35 having openings, and portion 12 connected to portion 13 of source electrode 11 is provided through the opening of passivation layer 35.

Thus, source pads 111 indicate regions of source electrode 11 that are partially exposed from the surface of semiconductor device 1, or stated differently, indicate terminal portions. Similarly, one or more gate pads 119 (illustrated in FIG. 3A) indicate regions of gate electrode 19 (illustrated in FIG. 3B) that are partially exposed from the surface of semiconductor device 1, or stated differently, indicate terminal portions.

FIG. 3A is a plan schematic diagram of semiconductor device 1. FIG. 3B is a plan schematic diagram that is an illustration in which passivation layer 35 and interlayer insulating layer 34 are removed, and portion 13 of source electrode 11 and gate electrode 19 that are originally directly under passivation layer 35 are exposed and visible in semiconductor device 1. To facilitate understanding, FIG. 3B illustrates body region 18, source pads 111, and gate pad 119 with broken lines, which are actually invisible in this state.

The plan schematic diagram illustrated in FIG. 1B may be considered as rectangular regions surrounded by dotted lines, which are clipped from FIG. 3A and FIG. 3B. The cross-sectional schematic diagrams illustrated in FIG. 2A and FIG. 2B may be considered as cross-sectional views of enlarged portions at and around an end portion in the Y direction in FIG. 3A.

The disposition of portion 13 of source electrode 11 and gate electrode 19 illustrated in FIG. 3B is an example, and gate electrode 19 surrounds substantially the entire perimeter of body region 18, and furthermore, portion 13 of source electrode 11 surrounds on the outer side thereof. With such a disposition, as illustrated in FIG. 2A and FIG. 2B, no matter in which direction first trenches 17 and second trenches 27 extend, first trenches 17 and second trenches 27 can be connected to gate electrode 19 and portion 13 of source electrode 11, respectively, at their ends in the direction.

In semiconductor device 1, assuming that, for example, the first conductivity type is an N type and the second conductivity type is a P type, source regions 14, semiconductor substrate 32, and low-concentration impurity layer 33 may be N-type semiconductors and body region 18 may be a P-type semiconductor.

In semiconductor device 1, assuming that, for example, the first conductivity type is a P type and the second conductivity type is an N type, source regions 14, semiconductor substrate 32, and low-concentration impurity layer 33 may be P-type semiconductors and body region 18 may be an N-type semiconductor.

[2. Operation of Vertical MOS Transistor]

In the following description, transistor 10 is assumed to be a so-called N channel transistor with the first conductivity type being an N type and the second conductivity type being a P type, and the conduction operation of semiconductor device 1 is described in such a case.

FIG. 4A and FIG. 4B are a plan schematic diagram and a perspective schematic diagram, respectively, of transistor 10 in a substantially unit configuration, which is repeatedly provided in the X direction and the Y direction of semiconductor device 1. In FIG. 4A and FIG. 4B, semiconductor substrate 32, metal layer 30, passivation layer 35, source electrode 11, and interlayer insulating layer 34 are not illustrated in order to facilitate understanding.

As illustrated in FIG. 4A and FIG. 4B, transistor 10 includes connection portions 18a that electrically connect body region 18 and source electrode 11. Connection portions 18a are regions in which source regions 14 are not provided in body region 18, and are of the second conductivity type, which is the same as the type of body region 18. Source regions 14 and connection portions 18a are alternately, cyclically, and repeatedly disposed in the Y direction.

In semiconductor device 1, when a high voltage is applied to drain electrode 30, a low voltage is applied to source electrode 11, and a voltage having at least a threshold is applied to gate electrode 19 with respect to source electrode 11, conduction channels are provided in the vicinity of gate insulating film 16 in body region 18. As a result, main current flows through a path of metal layer 30—semiconductor substrate 32—low-concentration impurity layer 33—the conduction channels provided in body region 18—source regions 14—source electrode 11, so that semiconductor device 1 is placed in the conduction state. A PN junction is present at the contact surface between body region 18 and low-concentration impurity layer 33 in the conduction path, and functions as a body diode.

When a high voltage is applied to source electrode 11 and a low voltage is applied to drain electrode 30, main current flows through a path of source electrode 11—connection portions 18a—body region 18—low-concentration impurity layer 33—semiconductor substrate 32—metal layer 30 through the body diode.

[3. Method for Manufacturing Semiconductor Device]

An example of a method for manufacturing transistor 10 in Embodiment 1 is described.

As illustrated in FIG. 5A, mask layer 38 that comprises oxide, for instance, is provided above an upper surface of semiconductor layer 40 (semiconductor substrate 32 and low-concentration impurity layer 33) in which body region 18 is selectively provided.

Next, as illustrated in FIG. 5B, resist applied onto mask layer 38 is patterned, and opening portions are provided at a predetermined pitch in the X direction. At this time, the width of the opening portions in the resist in the X direction ultimately becomes the width of second trenches 27.

Next, as illustrated in FIG. 5C, etching is performed in the opening portions in the resist, to remove mask layer 38 thereunder.

Next, as illustrated in FIG. 5D, the residual resist is patterned again, and portions where mask layer 38 is exposed are newly provided cyclically in the X direction.

The width of the opening portions newly provided in the resist in the X direction ultimately becomes the width of first trenches 17.

Next, as illustrated in FIG. 5E, the portions where mask layer 38 is newly exposed are etched in the process in FIG. 5D, and the portions of mask layer 38 are removed while maintaining a certain thickness above semiconductor layer 40.

Next, the resist is removed as illustrated in FIG. 5F. At the point in time when the process illustrated in FIG. 5F ends, mask layer 38 is thinner selectively only in portions that are to later become first trenches 17.

Next, as illustrated in FIG. 5G, mask layer 38 and semiconductor layer 40 are etched using partially remaining mask layer 38 as a mask. Through the etching in the process illustrated in FIG. 5G, etching on semiconductor layer 40 progresses from the beginning in portions where mask layer 38 has already been completely removed. In contrast, in portions where mask layer 38 has been left thinly, the thinly left portions of mask layer 38 are first completely removed, after that, semiconductor layer 40 directly under the portions starts to be etched, yet, at that time point, semiconductor layer 40 is being progressively etched in the portions where mask layer 38 has been completely removed from the beginning, so that trenches having alternatingly different depths are formed.

The difference between the depth of first trenches 17 and the depth of second trenches 27 can be controlled by manipulating the thickness of mask layer 38, conditions for etching, and the thickness of remaining mask layer 38 that is to be left above the upper surface of semiconductor layer 40 in the process illustrated in FIG. 5E, for instance.

Furthermore, the width of first trenches 17 and the width of second trenches 27, a pitch between first trenches 17, a pitch between second trenches 27, and a pitch between first trench 17 and second trench 27, for instance, can be freely designed by controlling dimensions for patterning the resist. In Embodiment 1, the dimensions are controlled to satisfy W1=W2/2.

Next, as illustrated in FIG. 5H, an insulating film (oxide film) is provided on the inner surfaces of first trenches 17 and second trenches 27. The insulating film provided here is gate insulating film 16 in first trenches 17, whereas in second trenches 27, the insulating film is shield insulating film 26 in the lower portions and is gate insulating film 16 in the upper portions. Mask layer 38 may remain. Typically, mask layer 38 and the insulating film are oxides having the same property.

Next, as illustrated in FIG. 5I, after filling the insides of first trenches 17 and second trenches 27, which have been provided, with a material that is to become conductors such as, for example, polysilicon, the material is etched by a certain amount. At this time, etching is adjusted so that the polysilicon does not remain inside first trenches 17. The polysilicon remaining only in the lower portions inside second trenches 27 is shield conductors 25.

Next, as illustrated in FIG. 5J, intermediate insulating film 36 is provided on the upper surfaces of shield conductors 25, and furthermore, as illustrated in FIG. 5K, the insides of first trenches 17 and upper portions of the insides of second trenches 27 (portions above intermediate insulating film 36) are filled with polysilicon again, thereafter the polysilicon is etched by a certain amount. The polysilicon provided at this time is gate conductors 15.

Next, as illustrated in FIG. 5L, interlayer insulating layer 34 is provided by providing an oxide film over the entire upper surface of semiconductor layer 40 including the upper surfaces of gate conductors 15.

Next, openings are provided in interlayer insulating layer 34, and source electrode 11 is provided above interlayer insulating layer 34 so as to be connected to source regions 14, body region 18, and shield conductors 25 through the openings. Furthermore, gate electrodes 19 are provided above interlayer insulating layer 34 so as to be connected to gate conductors 15 through the openings in interlayer insulating layer 34 (not illustrated).

Next, passivation layer 35 is provided to cover source electrode 11, gate electrode 19, and interlayer insulating layer 34, and furthermore, openings are provided in passivation layer 35 to provide source pads 111 and gate pad 119.

Through the above processing, structures of transistors 10 later obtained by singulation are provided on a silicon wafer in a grid. Note that description of providing source regions 14 and impurity injection to and heat treatment applied to gate conductors 15 and shield conductors 25 is omitted, but these can be performed between processes out of those illustrated in FIG. 5A to FIG. 5L.

Next, a thinning process is performed on the back surface of the silicon wafer (corresponding to semiconductor substrate 32 from the perspective of transistors 10 later obtained by singulation). In the thinning process, control may be performed to reduce the thickness of semiconductor layer 40 to at least 15 μm and at most 100 μm or furthermore, may be performed to reduce the thickness of semiconductor layer 40 to at least 15 μm and at most 75 μm.

Next, metal layer 30 is provided on the back surface of the silicon wafer on which the thinning process has been performed. Metal layer 30 may have a multi-layer configuration that includes a plurality of metal layers, for example. The plurality of metal layers may be individually provided by any of the following methods, that is, by deposition, sputtering, or plating.

Next, the silicon wafer is diced to obtain transistors 10 by singulation.

[4. Considerations]

In the following, effects yielded by semiconductor device 1 according to Embodiment 1 are described.

With regard to transistor 10 in semiconductor device 1, an electric potential difference between drain electrode 30 and source electrode 11 is referred to as a drain-source voltage or is simply referred to as a drain voltage (VDS [V]). A maximum specification voltage (BVDS [V]), which is normally stated in the product specification, is a voltage guaranteed for safe use of transistor 10 even if that voltage is applied across the drain and the source may be referred to as a drain breakdown voltage or may be simply referred to as a breakdown voltage in the present disclosure.

A PN junction is provided at the boundary between body region 18 and low-concentration impurity layer 33, and a depletion layer is generated across the PN junction. In order to increase the drain breakdown voltage, a structure is to be adopted in which when transistor 10 is off, the depletion layer can sufficiently expand and the intensity of an electric field that occurs in the depletion layer can be decreased.

As an example, in order that the depletion layer sufficiently expands, it is effective to decrease the carrier density of low-concentration impurity layer 33 (increase the resistivity thereof) or increase the thickness of low-concentration impurity layer 33. However, such measures are not preferable since the conduction resistance of a current path from a tip of gate trench 17 to drain electrode 30 is increased.

Transistor 10 according to Embodiment 1 includes shield trenches 27 deeper than gate trenches 17. Accordingly, shield trenches 27 physically push down the expansion of the depletion layer, and the intensity of an electric field that occurs in the vicinity of the tips of gate trenches 17 can be decreased. Furthermore, embedded shield conductors 25 have the same electric potential as that of source electrode 11, and thus effects of decreasing the gate-drain capacitance can also be achieved. Accordingly, the breakdown voltage of transistor 10 can be increased as compared with the case in which shield trenches 27 are not included.

On the other hand, generally, shield trenches 27 are provided deeper than gate trenches 17, and thus have side effects of inhibiting the movement of current, which flows through a tip of adjacent gate trench 17 toward drain electrode 30, from spreading in the X direction and flowing in low-concentration impurity layer 33.

FIG. 6 is a cross-sectional schematic diagram of transistor 10A in semiconductor device 1A according to Comparative Example 1 of Embodiment 1. Transistor 10A has a structure in which first trenches 17 are all replaced with second trenches 27, as compared with transistor 10 according to Embodiment 1. Thus, transistor 10A has a structure in which only split-type shield trenches 27 are present.

FIG. 7A and FIG. 7B schematically illustrate states of current flowing from source electrode 11 to drain electrode 30 in transistor 10 and transistor 10A, respectively, with open arrows. FIG. 7A is a cross-sectional schematic diagram of transistor 10, whereas FIG. 7B is a cross-sectional schematic diagram of transistor 10A in Comparative Example 1. The drawings each illustrate an enlarged portion of the structure, showing a state of current passing through conduction channels provided along one second trench 27.

As illustrated in FIG. 7A, in transistor 10 in Embodiment 1, current passing through conduction channels formed along an upper portion of second trench 27 in body region 18 tends to spread in the X direction and flow, since the resistivity of low-concentration impurity layer 33 is high. Since shallow first trenches 17 are adjacent on both sides of second trench 27, and thus current can sufficiently widely spread and flow. Accordingly, conduction resistance when current passes through low-concentration impurity layer 33 and semiconductor substrate 32 can be effectively decreased.

In contrast, as illustrated in FIG. 7B, in transistor 10A in Comparative Example 1, only deep second trenches 27 are provided, and thus current passing through conduction channels formed along an upper portion of second trench 27 in body region 18 cannot sufficiently spread in the X direction and flow in low-concentration impurity layer 33. Accordingly, conduction resistance when current passes through low-concentration impurity layer 33 is relatively high as compared with the case where current spreads and flows.

Thus, transistor 10 according to Embodiment 1 can yield effects of decreasing conduction resistance when current passes through low-concentration impurity layer 33 and semiconductor substrate 32.

Transistor 10A according to Comparative Example 1 can also yield effects of causing current to spread and flow in low-concentration impurity layer 33 and semiconductor substrate 32 by increasing the pitch between second trenches 27 in the X direction, similarly to transistor 10 according to Embodiment 1. However, in such a case, the pitch between gate conductors 15 in the X direction is also increased so that the total gate width is decreased, which results in an increase in conduction resistance when current passing through body region 18 (conduction channels).

Transistor 10 according to Embodiment 1 can yield effects of decreasing conduction resistance since the total gate width is not decreased, and furthermore can yield effects of decreasing conduction resistance when current passes through body region 18 and through low-concentration impurity layer 33 and semiconductor substrate 32.

Semiconductor device 1 according to Embodiment is semiconductor device 1 including: vertical metal-oxide semiconductor (MOS) transistor 10 that includes: semiconductor substrate 32 of a first conductivity type; low-concentration impurity layer 33 of the first conductivity type, low-concentration impurity layer 33 being provided above and in contact with semiconductor substrate 32 and having an impurity concentration lower than a predetermined impurity concentration of semiconductor substrate 32; body region 18 of a second conductivity type that is different from the first conductivity type, body region 18 being provided in low-concentration impurity layer 33; source region 14 of the first conductivity type, source region 14 being provided in body region 18; source electrode 11 electrically connected to body region 18 and source region 14; a plurality of first trenches 17 provided from an upper surface of low-concentration impurity layer 33 and penetrating through body region 18 to a depth up to a portion of low-concentration impurity layer 33, the plurality of first trenches 17 each having a portion in contact with source region 14 and extending in a first direction parallel to the upper surface of low-concentration impurity layer 33; and a plurality of second trenches 27 provided from the upper surface of low-concentration impurity layer 33 and penetrating through body region 18 to a depth deeper than the depth of the plurality of first trenches 17, the plurality of second trenches 27 each having a portion in contact with source region 14 and extending in the first direction. The plurality of first trenches 17 and the plurality of second trenches 27 are alternately disposed in a second direction parallel to the upper surface of low-concentration impurity layer 33 and orthogonal to the first direction, a plurality of first conductors 15 (gate conductors 15) connected to gate electrode 19 of vertical MOS transistor 10 are provided inside the plurality of first trenches 17 and in upper portions inside the plurality of second trenches 27, a plurality of second conductors 25 (shield conductors 25) connected to source electrode 11 and separated from the plurality of first conductors 15 are provided in lower portions inside the plurality of second trenches 27, and a pitch (W2) between the plurality of second conductors 25 in the second direction is twice a pitch (W1) between the plurality of first conductors 15 in the second direction (W2=2×W1).

By the way, first trenches 17 function in a state of being provided up to a shallower position (D1) than second trenches 27, and thus first trenches 17 may be provided to have a narrower width than that of second trenches 27. If at least first trenches 17 could be provided to have a narrow width, many gate conductors 15 can be embedded and provided in a limited area, so that the total gate width can be increased. An increase in the total gate width contributes to decreasing the conduction resistance of current passing through body region 18 (channels).

FIG. 8 is a cross-sectional schematic diagram when first trenches 17 are provided to have a narrower width than the width of second trenches 27. In transistor 10 according to Embodiment 1, first conductors 15 are provided in both a pair of first trench 17 and the upper portion of second trench 27 that are next to and adjacent to each other in the X direction. A position at the midpoint (• in the drawing) of the nearest-neighbor distance between first conductors 15 adjacent in the X direction is closer to first trench 17 than the position of the midpoint (○ in the drawing) of a pitch between first conductors 15 adjacent in the X direction.

If the width of first trenches 17 and the width of second trenches 27 are the same, the midpoints are in the same position. A position at the midpoint (• in the drawing) of the nearest-neighbor distance between first conductors 15 adjacent to each other in the X direction is closer to first trench 17 than the position of the midpoint (○ in the drawing) of a pitch between first conductors 15 adjacent to each other in the X direction, whereby the number of disposed first conductors 15 increases.

Thus, the midpoint of the nearest-neighbor distance between a pair of gate conductors 15 that are adjacent to each other in the X direction may be closer to first trench 17 than the midpoint of the pitch between the pair of gate conductors 15 adjacent to each other in the X direction.

Embodiment 2

In the following, semiconductor device 1B (transistor 10B) according to Embodiment 2 obtained by changing a partial configuration of semiconductor device 1 (transistor 10) according to Embodiment 1 is described.

Here, elements of transistor 10B according to Embodiment 2 equivalent to those of transistor 10 according to Embodiment 1 are assumed to be already described. Thus, such elements of transistor 10B are given the same reference signs and description thereof is omitted, so that differences thereof from transistor 10 are mainly described.

Transistor 10B according to Embodiment 2 is an example of a configuration in which first trenches 17 and second trenches 27 in transistor 10 according to Embodiment 1 are all changed to third trenches 37.

[1. Structure of Semiconductor Device]

FIG. 9A, FIG. 9C, and FIG. 9D are cross-sectional schematic diagrams illustrating examples of a structure of semiconductor device 1B (transistor 10B) according to Embodiment 2. FIG. 9B is a plan schematic diagram thereof. FIG. 9A illustrates a cut surface when semiconductor device 1B is cut along II-II in FIG. 9B, FIG. 9C illustrates a cut surface when semiconductor device 1B is cut along III-III in FIG. 9B, and FIG. 9D illustrates a cut surface when semiconductor device 1B is cut along IV-IV in FIG. 9B. Note that FIG. 9B gives illustration as if passivation layer 35, interlayer insulating layer 34, and source electrode 11 described later were transparent so that the structure thereunder is seen through and visible.

Third trenches 37 penetrate through source regions 14 and body region 18 from the upper surface of semiconductor layer 40 and reach a depth up to a portion of low-concentration impurity layer 33. Third trenches 37 extend in the Y direction, and are disposed at regular pitch W1 [μm] in the X direction, being aligned parallel to one another.

Third trenches 37 have a structure in which relatively shallow portions having a relatively shallow depth from the upper surface of semiconductor layer 40 (low-concentration impurity layer 33) and relatively deep portions having a relatively deep depth therefrom appear cyclically. Accordingly, as can be seen from comparisons between FIG. 9A, FIG. 9C, and FIG. 9D, the depth of even one third trench 37 appears to vary depending on a position in a cross-sectional view along the XZ plane.

Third trenches 37 have a so-called split-type structure. In each of third trenches 37, gate conductor 15 is embedded in an upper portion thereof, and shield conductor 25 is embedded in a lower portion thereof.

Shield insulating film 26 is provided on the inner surfaces of third trenches 37 in lower portions (bottom surfaces and portions of side surfaces), and shield conductors 25 are provided on shield insulating film 26 inside lower portions of third trenches 37. Shield conductors 25 are embedded electrodes that are embedded in semiconductor layer 40. Note that since the depths of third trenches 37 cyclically vary, the lengths of shield conductors 25 in the Z direction cyclically vary accordingly, depending on a position in a cross-sectional view along the XZ plane.

Intermediate insulating film 36 is provided above shield conductor 25 and shield insulating film 26, in each of third trenches 37. The position at which intermediate insulating film 36 is provided is the position at depth D1 [μm] from the upper surface of semiconductor layer 40. Specifically, intermediate insulating film 36 is provided inside third trenches 37 at the same position as the depth of first trenches 17 of transistor 10 according to Embodiment 1.

Gate insulating film 16 is provided inside third trenches 37 on the inner surfaces (portions of side surfaces) at positions shallower than depth D1 (above intermediate insulating film 36), and gate conductors 15 are provided above intermediate insulating film 36 inside third trenches 37. Gate conductors 15 are embedded electrodes that are embedded in semiconductor layer 40 in third trenches 37. Note that the length of gate conductor 15 in the Z direction is unchanged and constant, irrespective of the position in a cross-sectional view along the XZ plane.

One third trench 37 cyclically has, in the Y direction, relatively shallow portions having a relatively shallow depth from the upper surface of semiconductor layer 40 (low-concentration impurity layer 33) and relatively deep portions having a relatively deep depth therefrom. In the Y direction, a pitch at which the relative deep portions are provided is W2 [μm]. The relatively deep portions have a depth of D2 [μm] from the upper surface of semiconductor layer 40 (low-concentration impurity layer 33). The length of the relatively deep portions in the Y direction is the same as the width of third trenches 37 in the X direction, as an example.

The depth of the relatively shallow portions from the upper surface of semiconductor layer 40 (low-concentration impurity layer 33) is greater than D1 and smaller than D2. The length of the relatively shallow portions in the Y direction is the same as the length resulting from subtracting the width of third trenches 37 in the X direction from W2, as an example.

Thus, gate conductors 15 are disposed at a regular pitch of W1 in the X direction. On the other hand, portions in which shield conductors 25 reach depth D2 are provided at regular pitch of W2 in the Y direction. Note that similarly to transistor 10 according to Embodiment 1, it is reasonable to assume that W1<W2 is satisfied also in transistor 10B.

The relatively deep portions of third trenches 37 are regularly disposed within the XY plane. As an example, the relatively deep portions are provided at positions corresponding to the apexes of virtual triangles partially indicated by the broken lines in FIG. 9B. Stated differently, in the plan view of semiconductor layer 40, relatively deep portions at closest three locations, which are included in a pair of (two) adjacent third trenches 37 among third trenches 37, appear to be provided corresponding to the apexes of an equilateral triangle. Thus, W1 and W2 satisfy $$W1:W2 = \sqrt{3}:2 \qquad \text{[Math. 1]}$$

FIG. 10 is a cross-sectional schematic diagram along the YZ plane at a portion in which one of third trenches 37 extends in the Y direction and ends. Gate conductors 15 provided inside third trenches 37 are connected to gate electrode 19 illustrated in FIG. 10, and have the same electric potential as the electric potential of gate electrode 19. Shield conductors 25 provided in third trenches 37 are connected to source electrode 11 illustrated in FIG. 9A and FIG. 10, and have the same electric potential as the electric potential of source electrode 11.

[2. Method for Manufacturing Semiconductor Device]

An example of a method for manufacturing transistor 10B in Embodiment 2 is described.

FIG. 11A to FIG. 11K are schematic diagrams illustrating some of the processes of manufacturing transistor 10B. The top row shows a plan schematic diagram (the XY plane) in the plan view, the middle row shows a cross-sectional schematic diagram (the XZ plane) when transistor 10B is cut along a-a in the plan schematic diagram, and the bottom row shows a cross-sectional schematic diagram (the XZ plane) when transistor 10B is cut along b-b in the plan schematic diagram.

First, as illustrated in FIG. 11A, mask layer 38 that comprises oxide, for instance, is provided above an upper surface of semiconductor layer 40 (semiconductor substrate 32 and low-concentration impurity layer 33) in which body region 18 is selectively provided. Next, as illustrated in FIG. 11B, resist applied onto mask layer 38 is patterned to provide opening portions. At this time, where the openings are provided in the resist correspond to portions of third trenches 37 that later reach the depth of D2. Next, mask layer 38 at the opening portions is removed as illustrated in FIG. 11C.

Next, as illustrated in FIG. 11D, the resist is additionally patterned to provide openings in the resist at positions that later define the width of third trenches 37. Next, as illustrated in FIG. 11E, mask layer 38 at the opening portions of the resist is removed while maintaining a certain thickness. Next, the resist is removed as illustrated in FIG. 11F.

Next, as illustrated in FIG. 11G, mask layer 38 and semiconductor layer 40 are etched using partially remaining mask layer 38 as a mask. At this time, semiconductor layer 40 is being progressively etched from the beginning in the portions of mask layer 38 completely removed in the process illustrated in FIG. 11C. On the other hand, first, mask layer 38 is completely removed from the portions where mask layer 38 is left thin in the process illustrated in FIG. 11E, and thereafter semiconductor layer 40 immediately under the portions starts to be etched. However, semiconductor layer 40 is being progressively etched in portions in which mask layer 38 has been already completely removed at the point in time, and thus trenches having different depths are provided in semiconductor layer 40. Through the above processes, depths of third trenches 37 are controlled.

Next, as illustrated in FIG. 11H, an insulating film (oxide film) is provided on the inner surfaces of provided third trenches 37. At this time, the oxide film provided on the bottom portions and lower side surfaces of third trenches 37 is shield insulating film 26. Next, as illustrated in FIG. 11I, the insides of third trenches 37 are filled with a material that is to become conductors such as, for example, polysilicon, and thereafter the polysilicon is etched by a certain amount to adjust the polysilicon to remain only in lower portions inside third trenches 37. The remaining polysilicon is shield conductors 25.

Next, as illustrated in FIG. 11J, intermediate insulating film 36 is provided on the upper surfaces of shield conductors 25. Next, as illustrated in FIG. 11K, after filling third trenches 37 with polysilicon again, the polysilicon is etched by a certain amount. Gate conductors 15 are provided at this time.

The subsequent processes are the same as those (FIG. 5L and the drawings thereafter) in the manufacturing method described in Embodiment 1, and thus description thereof is omitted. In the processes of manufacturing semiconductor device 1B according to Embodiment 2, description of providing source regions 14 included in semiconductor layer 40 and impurity injection to and heat treatment applied to gate conductors 15 and shield conductors 25 is omitted, but these can be performed between processes out of those illustrated in FIG. 11A to FIG. 11K.

[3. Considerations]

In the following, the effects yielded by semiconductor device 1B according to Embodiment 2 are described.

Also, transistor 10B includes shield conductors 25 that reach deeper positions than intermediate insulating film 36, similarly to transistor 10 according to Embodiment 1. In particular, relatively deep portions of third trenches 37 physically push down the expansion of a depletion layer, and thus the intensity of an electric field that occurs in the vicinity of gate conductors 15 and intermediate insulating film 36 can be decreased. Furthermore, embedded shield conductors 25 have the same electric potential as that of source electrode 11, and thus effects of decreasing the gate-drain capacitance can also be achieved. Accordingly, the breakdown voltage of transistor 10B increases as compared with the case in which relatively deep portions of third trenches 37 are not included.

The relatively deep portions of third trenches 37 may also be referred to as shield trenches in the following.

As illustrated in FIG. 9B, the relatively deep portions of third trenches 37 (shield trenches) are provided at regular pitch W2 in the Y direction in the plan view. Furthermore, if W1<W2 is satisfied, effects of physically pushing down the expansion of the depletion layer between the closest shield trenches are substantially the same as those yielded by transistor 10 according to Embodiment 1.

While effects of increasing a breakdown voltage can be substantially equally obtained, as compared with transistor 10 according to Embodiment 1, in transistor 10B according to Embodiment 2, the positions where shield trenches are provided are significantly less in the plan view. As can be seen from FIG. 9B and FIG. 9D, most of the portions of third trenches 37 do not reach depth D2 in the Y direction in the cross-sectional views along the XZ plane. Accordingly, in low-concentration impurity layer 33 and semiconductor substrate 32, there is almost nothing that hinders the flow, in an expanding manner in the X direction, of current that is to pass through toward drain electrode 30 via the tip of adjacent gate conductor 15.

Thus, transistor 10B according to Embodiment 2 can yield effects of further decreasing conduction resistance when current passes through low-concentration impurity layer 33 and semiconductor substrate 32 more than transistor 10 according to Embodiment 1 can do. This is further clarified from the comparison between FIG. 9D and FIG. 7A shown in relation to transistor 10 according to Embodiment 1.

Similarly to second trenches 27 (FIG. 2B) in transistor 10 according to Embodiment 1, also in transistor 10B according to Embodiment 2, gate conductors 15 and shield conductors 25 embedded in third trenches 37 can be readily connected to gate electrode 19 and portion 13 of source electrode 11, respectively, at their end portions in the Y direction, and thus transistor 10B can be readily obtained also from the perspective of providing the structure, as illustrated in FIG. 10.

Hence, semiconductor device 1B according to Embodiment 2 is semiconductor device 1B including: vertical metal-oxide semiconductor (MOS) transistor 10B that includes: semiconductor substrate 32 of a first conductivity type; low-concentration impurity layer 33 of the first conductivity type provided above and in contact with semiconductor substrate 32 and having an impurity concentration lower than a predetermined impurity concentration of semiconductor substrate 32; body region 18 of a second conductivity type that is different from the first conductivity type, body region 18 being provided in low-concentration impurity layer 33; source region 14 of the first conductivity type, source region 14 being provided in body region 18; source electrode 11 electrically connected to body region 18 and source region 14; and a plurality of third trenches 37 provided from an upper surface of low-concentration impurity layer 33 and penetrating through body region 18 to a depth up to a portion of low-concentration impurity layer 33, the plurality of third trenches 37 each having a portion in contact with source region 14 and extending in a first direction (the Y direction) parallel to the upper surface of low-concentration impurity layer 33. The plurality of third trenches 37 are disposed at regular pitch W1 in a second direction parallel to the upper surface of low-concentration impurity layer 33 and orthogonal to the first direction, a plurality of first conductors 15 (gate conductors 15) connected to gate electrode 19 of vertical MOS transistor 10B are provided in upper portions inside the plurality of third trenches 37, a plurality of second conductors 25 (shield conductors 25) connected to source electrode 11 and separated from the plurality of first conductors 15 are provided in lower portions inside the plurality of third trenches 37, the plurality of third trenches 37 each include relatively shallow portions and relatively deep portions cyclically in the first direction, the relatively shallow portions having a relatively shallow depth from the upper surface of low-concentration impurity layer 33, the relatively deep portions having a relatively deep depth from the upper surface of low-concentration impurity layer 33, in the first direction, the plurality of first conductors 15 have a fixed length in a third direction orthogonal to both of the first direction and the second direction, and a length of each of the plurality of second conductors 25 in the third direction cyclically (at pitch W2) varies in the first direction.

Effects of increasing a breakdown voltage can be most effectively obtained if the shield trenches of transistor 10B are disposed in the arrangement corresponding to the apexes of equilateral triangles. This is because the shield trenches are disposed at a regular pitch two-dimensionally within the XY plane, not only in the Y direction. The effects of physically pushing down the expansion of the depletion layer can be substantially uniformly yielded in the inner areas of the equilateral triangles. Furthermore, the equilateral triangles having apexes at the positions in which the shield trenches are disposed in the plan view thoroughly fill the plane as portions thereof are virtually shown with broken lines in FIG. 9B. Thus, the breakdown voltage can be uniformly increased in the entire plane.

In semiconductor device 1B according to Embodiment 2, in a plan view of semiconductor layer 40, the relatively deep portions (shield trenches) at closest three locations in a pair of adjacent trenches among the plurality of third trenches 37 may be disposed in correspondence with apexes of an equilateral triangle.

In semiconductor device 1B according to Embodiment 2, when W1 denotes a pitch between the plurality of third trenches 37 in the second direction (the X direction), and W2 denotes a pitch at which the relatively deep portions (shield trenches) of the plurality of third trenches 37 are provided in the first direction (the Y direction), $$W1{:}W2 = \sqrt{3}{:}2 \qquad \text{[Math. 2]}$$

may be satisfied.

If the above geometrical relation is satisfied, even if relatively deep portions (shield trenches) in three locations close to one another are not disposed in the arrangement corresponding to the apexes of equilateral triangles, the nearest-neighbor distance can be made W2 or less in two combinations out of three combinations of two points in the shield trenches in the three locations, in the plan view. Accordingly, effects of increasing the breakdown voltage of transistor 10B by a certain degree can be yielded.

Embodiment 3

In the following, semiconductor device 1C (transistor 10C) according to Embodiment 3 obtained by changing a partial configuration of semiconductor device 1 (transistor 10) according to Embodiment 1 is described.

Here, elements of transistor 10C according to Embodiment 3 equivalent to those of transistor 10 according to Embodiment 1 are assumed to be already described. Thus, such elements of transistor 10C are given the same reference signs and description thereof is omitted, so that differences thereof from transistor 10 are mainly described.

In transistor 10C according to Embodiment 3, first trenches 17 extending in the Y direction, which are described in relation to transistor 10 according to Embodiment 1, are disposed at a regular pitch in the X direction. An example of a configuration changed to allow fourth trenches 47 that substitute second trenches 27 to extend in a direction orthogonal to the direction in which first trenches 17 extend is shown.

[1. Structure of Semiconductor Device]

FIG. 12A, FIG. 12B, FIG. 12C, and FIG. 12D are cross-sectional schematic diagrams illustrating examples of a structure of semiconductor device 1C (transistor 10C) according to Embodiment 3. FIG. 12E is a plan schematic diagram thereof, FIG. 12A illustrates a cut surface when transistor 10C is cut along V-V in FIG. 12E, FIG. 12B illustrates a cut surface when transistor 10C is cut along VI-VI in FIG. 12E, FIG. 12C illustrates a cut surface when transistor 10C is cut along VII-VII in FIG. 12E, and FIG. 12D illustrates a cut surface when transistor 10C is cut along VIII-VIII in FIG. 12E. Note that FIG. 12E gives illustration as if passivation layer 35, interlayer insulating layer 34, and source electrode 11 described later were transparent so that the structure thereunder is seen through and visible.

First trenches 17 extend in the Y direction and are aligned in the X direction at regular pitch W1 [μm], parallel to each other in stripes, whereas fourth trenches 47 extend in the X direction and aligned at regular pitch W2 [μm] in the Y direction, parallel to each other in stripes. Pitch W2 between fourth trenches 47 that extend in the X direction and the pitch of the repeated cycle of connection portions 18a and source regions 14 may or may not coincide with each other. FIG. 12C and FIG. 12E illustrate the case in which the repeated cycle and W2 coincide with each other.

First trenches 17 are provided to penetrate through source regions 14 and body region 18 from the upper surface of semiconductor layer 40 and reach depth D1 [μm] up to a portion of low-concentration impurity layer 33. Similarly, fourth trenches 47 are provided to penetrate through body region 18 from the upper surface of semiconductor layer 40 and reach depth D2 [μm] up to a portion of low-concentration impurity layer 33. D2 is greater than D1 (D1<D2).

Gate conductors 15 are provided being embedded inside first trenches 17, whereas shield conductors 25 are provided being embedded inside fourth trenches 47.

[2. Method for Manufacturing Semiconductor Device]

An example of a method for manufacturing transistor 10C in Embodiment 3 is described.

FIG. 13A to FIG. 13K show cross-sectional schematic diagrams illustrating processes of manufacturing transistor 10C. The first and second columns from the left show cross-sectional schematic diagrams along the XZ plane, the first column shows a cut surface when transistor 10C is cut along V-V in FIG. 12E (note that illustration of source regions 14 is omitted), and the second column shows a cut surface when transistor 10C is cut along VI-VI in FIG. 12E. The third and fourth columns from the left show cross-sectional schematic diagrams along the YZ plane, the third column shows a cut surface when transistor 10C is cut along VII-VII in FIG. 12E (note that illustration of source regions 14 is omitted), and the fourth column shows a cut surface when transistor 10C is cut along VIII-VIII in FIG. 12E.

Similarly to the manufacturing method according to Embodiment 1, mask layer 38 is provided above the upper surface of semiconductor layer 40 in which body region 18 is selectively provided, and furthermore, mask layer 38 is partially removed using opening portions of a resist applied onto mask layer 38. FIG. 13A illustrates a state at this time. Regions in which mask layer 38 is removed are regions that extend in the X direction and have a constant pitch in the Y direction. At this time, the constant pitch is pitch W2 between adjacent fourth trenches 47 later described, and the width of opening portions in mask layer 38 in the Y direction ultimately becomes the width of fourth trenches 47.

Next, the resist is removed, and as illustrated in FIG. 13B, semiconductor layer 40 is etched using partially remaining mask layer 38 as a mask. By performing the process of etching illustrated in FIG. 13B, fourth trenches 47 extending in the X direction are provided in semiconductor layer 40 at the depth of D2 [μm] from the upper surface of semiconductor layer 40.

Next, an insulating film (oxide film) is provided on the inner surfaces of fourth trenches 47, as illustrated in FIG. 13C. The insulating film provided here is shield insulating film 26 for fourth trenches 47. At this time, mask layer 38 may remain, yet after shield insulating film 26 is provided, mask layer 38 is removed to cause the upper surface of semiconductor layer 40 to be just exposed. FIG. 13C illustrates the state at this time. Note that typically, mask layer 38 and shield insulating film 26 are oxides of the same quality.

Next, as illustrated in FIG. 13D, the insides of fourth trenches 47 are filled with a material that is to become conductors, such as polysilicon, for example.

Next, the polysilicon is etched until the upper surface of semiconductor layer 40 is exposed. At this time, the upper surfaces of the polysilicon filling the insides of fourth trenches 47 and the upper surface of semiconductor layer 40 may be flush with one another. The polysilicon that remains inside fourth trenches 47 is shield conductors 25. After providing shield conductors 25 inside fourth trenches 47, mask layer 38 is provided on semiconductor layer 40 and shield conductor 25. FIG. 13E illustrates the state at this time.

Next, as illustrated in FIG. 13F, portions of mask layer 38 are removed using the opening portions of the resist applied onto mask layer 38. The portions in which mask layer 38 is removed are regions that extend in the Y direction and have a regular pitch in the X direction. At this time, the regular pitch is pitch W1 between adjacent first trenches 17 later described, and the width of opening portions in mask layer 38 in the X direction ultimately becomes the width of first trenches 17.

Next, as illustrated in FIG. 13G, semiconductor layer 40 is etched using partially remaining mask layer 38 as a mask. By performing the process of etching illustrated in FIG. 13G, first trenches 17 extending in the Y direction are provided in semiconductor layer 40 to have a depth of D1 [μm] from the upper surface of semiconductor layer 40.

Next, an insulating film (oxide film) is provided on the inner surfaces of first trenches 17, as illustrated in FIG. 13H. The insulating film provided here is gate insulating film 16 for first trenches 17. At this time, mask layer 38 may remain. Typically, mask layer 38 and gate insulating film 16 are oxides having the same property.

Next, as illustrated in FIG. 13I, the insides of first trenches 17 are filled with a material that is to become conductors, such as polysilicon, for example.

Next, as illustrated in FIG. 13J, the polysilicon is etched so as not to remain on the upper surface of semiconductor layer 40. The polysilicon that remains inside first trenches 17 is gate conductors 15.

Next, as illustrated in FIG. 13K, an oxide film is provided, as interlayer insulating layer 34, on the upper surface of semiconductor layer 40.

The subsequent processes are the same as those (after FIG. 5L) in the manufacturing method described in Embodiment 1, and thus description thereof is omitted.

In the processes of manufacturing semiconductor device 1C according to Embodiment 3, description of providing source regions 14 included in semiconductor layer 40 and impurity injection to and heat treatment applied to gate conductors 15, shield conductors 25, and others is omitted, but these can be performed between processes out of those illustrated in FIG. 13A to FIG. 13K.

Furthermore, the width of first trench 17 and the width of fourth trench 47, a pitch between first trenches 17, and a pitch between fourth trenches 47, for instance, can be freely designed by controlling dimensions for patterning the resist.

[3. Considerations]

In the following, effects yielded by semiconductor device 1C according to Embodiment 3 are described.

With regard to transistor 10C, first trench 17 is referred to as gate trench 17, and fourth trench 47 is referred to as shield trench 47.

Shield trenches 47 reach positions (D2) deeper than gate trenches 17 and physically push down the expansion of a depletion layer, and thus can reduce the intensity of an electric field that occurs in the vicinity of the tips of gate trenches 17. Furthermore, embedded shield conductors 25 have the same electric potential as that of source electrode 11, and thus effects of decreasing the gate-drain capacitance can also be achieved. Accordingly, the breakdown voltage of transistor 10C can be increased as compared with the case in which shield trenches 47 are not included.

As illustrated in FIG. 12C, FIG. 12D, and FIG. 12E, shield trenches 47 are disposed in strips at regular pitch W2. Accordingly, effects of physically pushing down the expansion of the depletion layer by shield trenches 47 are similarly yielded to the case of transistor 10 according to Embodiment 1.

However, shield trenches 47 of transistor 10C according to Embodiment 3 extend in the X direction. Stated differently, shield trenches 47 are disposed orthogonally to the direction in which gate trenches 17 extend. Accordingly, in low-concentration impurity layer 33 and semiconductor substrate 32, there is almost nothing that hinders the flow, in an expanding manner in the X direction, of current that is to pass through toward drain electrode 30 via the tips of gate trenches 17.

This is clear from the comparison between FIG. 12A and FIG. 7A shown in connection with transistor 10 according to Embodiment 1. Transistor 10C according to Embodiment 3 appears as if shield trenches 47 are not present at most of the positions in cross-sectional views along the XZ plane. Thus, transistor 10C according to Embodiment 3 can yield effects of decreasing conduction resistance when current passes through low-concentration impurity layer 33 and semiconductor substrate 32 more than transistor 10 according to Embodiment 1 can do.

Thus, semiconductor device 1C according to Embodiment 3 is semiconductor device 1C including: vertical metal-oxide semiconductor (MOS) transistor 10C that includes: semiconductor substrate 32 of a first conductivity type; low-concentration impurity layer 33 of the first conductivity type, low-concentration impurity layer 33 being provided above and in contact with semiconductor substrate 32 and having an impurity concentration lower than a predetermined impurity concentration of semiconductor substrate 32; body region 18 of a second conductivity type that is different from the first conductivity type, body region 18 being provided in low-concentration impurity layer 33; a plurality of source regions 14 of the first conductivity type, the plurality of source regions 14 being provided in body region 18; source electrode 11 electrically connected to body region 18 and the plurality of source regions 14; a plurality of first trenches (gate trenches) 17 provided from an upper surface of low-concentration impurity layer 33 and penetrating through body region 18 to a depth up to a portion of low-concentration impurity layer 33, the plurality of first trenches 17 each having a portion in contact with at least one of the plurality of source regions 14 and extending in a first direction (the Y direction) parallel to the upper surface of low-concentration impurity layer 33; and a plurality of fourth trenches (shield trenches) 47 provided from the upper surface of low-concentration impurity layer 33 and penetrating through body region 18 to a depth deeper than the depth of the plurality of first trenches 17, the plurality of fourth trenches 47 extending in a second direction (the X direction) parallel to the upper surface of low-concentration impurity layer 33 and orthogonal to the first direction. A plurality of first conductors 15 (gate conductors 15) connected to gate electrode 19 of vertical MOS transistor 10C are provided inside the plurality of first trenches 17, and a plurality of second conductors 25 (shield conductors 25) connected to source electrode 11 are provided inside the plurality of fourth trenches 47.

Note that if pitch W1 between first trenches (gate trenches) 17 is decreased, the total gate width increases and conduction resistance when current passes through body region 18 (conduction channels) decreases. Accordingly, W1 may be set to be as small as possible.

In contrast, when pitch W2 of shield trenches 47 is too narrow, a degree of hindering the flow, in an expanding manner in the X direction, of current that is to pass through toward drain electrode 30 via the tips of gate trenches 17 in low-concentration impurity layer 33 and semiconductor substrate 32 increases. Accordingly, pitch W2 between shield trenches 47 may be greater than pitch W1 between gate trenches 17, as a criterion.

Thus, the plurality of first trenches (gate trenches) 17 may be disposed at regular pitch W1 in the second direction (the X direction), the plurality of fourth trenches (shield trenches) 47 may be disposed at regular pitch W2 in the first direction (the Y direction), and pitch W1 between the plurality of first trenches 17 in the second direction is smaller than pitch W2 between the plurality of fourth trenches 47 in the first direction (W1<W2).

First trenches (gate trenches) 17 and fourth trenches (shield trenches) 47 can be readily connected, at their ends, to gate electrode 19 and source electrode 11, respectively.

Specifically, gate conductors 15 embedded in first trenches 17 are connected, at the end portions in the Y direction, to gate electrode 19, as illustrated in FIG. 14A. Similarly, shield conductors 25 embedded in fourth trenches 47 can be connected, at the end portions in the X direction, to source electrode 11, as illustrated in FIG. 14B. Accordingly, the structure according to Embodiment 3 may be adopted from the view of readily making connection to electrodes.

In view of this, as a variation of Embodiment 3, fourth trenches 47 of transistor 10C may be replaced with second trenches 27 (having a split-type structure in which gate conductors 15 are disposed in upper portions) described in Embodiment 1. Stated differently, this structure is the same as a structure in which the direction in which second trenches 27 extend is changed, second trenches 27 extend in a direction (the X direction) orthogonal to first trenches 17 and are disposed at regular pitch W2 in the Y direction, and furthermore, first trenches 17 are disposed at regular pitch W1 in transistor 10 according to Embodiment 1.

In the structure according to the above variation, first trenches 17 and second trenches 27 are disposed in a lattice in the plan view, and both contribute to the conduction in body region 18. Since the total gate width significantly increases, effects of greatly reducing conduction resistance can be obtained.

Current that passes through the vicinity of gate conductors 15 in upper portions of second trenches 27 and is to flow toward drain electrode 30 can hardly flow in an expanding manner in the Y direction in low-concentration impurity layer 33 and semiconductor substrate 32, but nevertheless there is almost nothing that hinders the flow, in an expanding manner in the X direction, of current that is to pass through toward drain electrode 30 via the tips of first trenches (gate trenches) 17, in low-concentration impurity layer 33 and semiconductor substrate 32. Accordingly, conduction resistance of current flowing through low-concentration impurity layer 33 and semiconductor substrate 32 can be reduced.

The above has described semiconductor devices according to aspects of the present disclosure, based on Embodiment 1 to Embodiment 3 and the variations, yet the present disclosure is not limited to the embodiments or the variations. The scope of one or more aspects of the present disclosure may also encompass embodiments resulting from applying, to those embodiments, various modifications that may be conceived by those skilled in the art, and embodiments resulting from combining elements in different embodiments and variations, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A semiconductor device that includes a vertical MOS transistor according to the present application can be widely used as a device that controls conduction states of current paths.

The invention claimed is:

1. A semiconductor device comprising:
a vertical metal-oxide semiconductor (MOS) transistor that includes:
a semiconductor substrate of a first conductivity type;
a low-concentration impurity layer of the first conductivity type, the low-concentration impurity layer being provided above and in contact with the semiconductor substrate and having an impurity concentration lower than a predetermined impurity concentration of the semiconductor substrate;
a body region of a second conductivity type that is different from the first conductivity type, the body region being provided in the low-concentration impurity layer;
a source region of the first conductivity type, the source region being provided in the body region;
a source electrode electrically connected to the body region and the source region;
a plurality of first trenches provided from an upper surface of the low-concentration impurity layer and penetrating through the body region to a depth up to a portion of the low-concentration impurity layer, the plurality of first trenches each having a portion in contact with the source region and extending in a first direction parallel to the upper surface of the low-concentration impurity layer; and
a plurality of second trenches provided from the upper surface of the low-concentration impurity layer and penetrating through the body region to a depth deeper than the depth of the plurality of first trenches, the plurality of second trenches each having a portion in contact with the source region and extending in the first direction with a constant width in a second direction parallel to the upper surface of the low-concentration impurity layer and orthogonal to the first direction,
wherein the plurality of first trenches and the plurality of second trenches are alternately disposed in the second direction,
a plurality of first conductors connected to a gate electrode of the vertical MOS transistor are provided inside the plurality of first trenches and in upper portions inside the plurality of second trenches,
a plurality of second conductors connected to the source electrode and separated from the plurality of first conductors are provided in lower portions inside the plurality of second trenches,
a pitch between the plurality of second conductors in the second direction is twice a pitch between the plurality of first conductors in the second direction,
a midpoint of a nearest-neighbor distance between a pair of first conductors adjacent to each other in the second direction among the plurality of first conductors is closer to one of the plurality of first trenches than a midpoint of a pitch between the pair of the first conductors adjacent to each other in the second direction,
a width in the second direction of each of first conductors provided inside the plurality of first trenches among the plurality of first conductors is narrower than a width in the second direction of each of first conductors provided inside the plurality of second trenches among the plurality of first conductors, and
the width in the second direction of each of first conductors provided inside the plurality of first trenches among the plurality of first conductors is narrower than a width in the second direction of each of the plurality of second conductors provided inside the plurality of second trenches.

2. The semiconductor device according to claim 1,
wherein inside the plurality of second trenches, an insulating film that separates the first conductors among the plurality of first conductors from the plurality of second conductors is provided at a position at a depth that is same as the depth of the plurality of first trenches in a third direction orthogonal to the first direction and the second direction.

3. The semiconductor device according to claim 1, wherein a width in the second direction of each of the plurality of first trenches is narrower than a width in the second direction of each of the plurality of second trenches.

4. The semiconductor device according to claim 1, wherein:
a plurality of source regions are provided in the vertical MOS transistor,
the vertical MOS transistor comprises a plurality of connection portions that electrically connect the body region and the source electrode, and alternately arranged with the plurality of source regions in the first direction, and
the plurality of second trenches are adjacent to the plurality of source regions and the plurality of connection portions.

* * * * *